United States Patent [19]

Sakata et al.

[11] Patent Number: 5,140,149
[45] Date of Patent: Aug. 18, 1992

[54] OPTICAL APPARATUS USING WAVELENGTH SELECTIVE PHOTOCOUPLER

[75] Inventors: Hajime Sakata, Hiratsuka; Hidetoshi Nojiri, Hadano, both of Japan

[73] Assignee: Canon Kabushiki Kaisha, Tokyo, Japan

[21] Appl. No.: 796,929

[22] Filed: Nov. 22, 1991

Related U.S. Application Data

[63] Continuation of Ser. No. 491,203, Mar. 9, 1990, abandoned.

[30] Foreign Application Priority Data

| Mar. 10, 1989 | [JP] | Japan | 1-56142 |
| Mar. 14, 1989 | [JP] | Japan | 1-59825 |
| Mar. 22, 1989 | [JP] | Japan | 1-67520 |
| Apr. 24, 1989 | [JP] | Japan | 1-101791 |
| Aug. 7, 1989 | [JP] | Japan | 1-202797 |

[51] Int. Cl.⁵ .................................................. H01J 40/14
[52] U.S. Cl. ........................... 250/211 J; 250/226; 372/50; 385/50
[58] Field of Search .............. 250/211 R, 211 J, 226; 350/96.11, 96.12; 372/50

[56] References Cited

U.S. PATENT DOCUMENTS

| 4,680,769 | 7/1987 | Miller | 372/50 |
| 4,730,327 | 3/1988 | Gordon | 372/50 |
| 4,747,650 | 5/1988 | Sakuda | 350/96.14 |
| 4,755,015 | 7/1988 | Uno et al. | 372/50 |
| 4,776,661 | 10/1988 | Handa | 350/96.19 |
| 4,811,352 | 3/1989 | Suzuki et al. | 372/50 |
| 4,843,609 | 6/1989 | Ohya et al. | 372/50 |
| 4,852,961 | 8/1989 | Yamamoto et al. | 350/96.11 |
| 4,904,045 | 2/1990 | Alferness et al. | 350/96.19 |

FOREIGN PATENT DOCUMENTS

| 0187979 | 12/1985 | Fed. Rep. of Germany. |
| 61-250607 | 11/1986 | Japan. |
| 63-198005 | 8/1988 | Japan. |

OTHER PUBLICATIONS

R. C. Alferness et al., Appl. Phys. Lett. 33, p. 161 (1978).
Study Report OQE81-129, Institute of Electronics and Communications Engineers of Japan, Miki et al.
R. C. Alferness et al., Integrated and Guided-Wave Optics Technical Digest Series, vol. IV, pp. 215-218 (1989).
R. C. Alferness et al., Appl. Phys. Lett. 55, pp. 2011-2013 (1984).

(List continued on next page.)

Primary Examiner—David C. Nelms
Assistant Examiner—Que T. Le
Attorney, Agent, or Firm—Fitzpatrick, Cella, Harper & Scinto

[57] ABSTRACT

The present invention relates to optical apparatus such as a photosensor, a semiconductor laser, an optical amplifier in which a wavelength selective photocoupler is used so as to couple two waveguides through a diffraction grating.

A photosensor which is one of the optical apparatus according to the present invention comprises a substrate, a first waveguide layer formed on the substrate, a second waveguide layer formed on the first waveguide layer to be stacked in a direction of thickness and which has a guided mode difference from that of the first waveguide layer, a diffraction grating formed on an overlapping region of the guided modes of the first and second waveguide layers and which couples light components of a specific wavelength range of light propagating through the first waveguide layer to the second waveguide layer, a light absorption layer for absorbing at least some light components of the light components coupled to the second waveguide layer, and an electrode for converting the light components absorbed by the light absorption layer into an electrical signal and outputting the electrical signal.

59 Claims, 14 Drawing Sheets

OTHER PUBLICATIONS

"Directional Couplers Made of Nonidentical Asymmetric Slabs. Part II: Grating-Assisted Couplers", by D. Marcuse, Journal of Lightwave Technology, vol. LT-5, No. 2, pp. 268-273 (1987).

"III-V Heterostructure Devices for Integrated Optics", by J. L. Merz, Optical Engineering, vol. 19, No. 4, pp. 581-586 (1980).

"Interlayer-Directionally Grating-Coupled III-V Arrow Structures for Integrated Opto-electronics", by T. L. Koch et al., Topical Meeting on Semiconductor Lasers, Feb. 10-11, 1987, Albuquerque, N.M., pp. 24-26.

"Integrated Waveguide Coupler", by F. L. Galeener et al., Xerox Disclosure Journal, vol. 4, No. 3, pp. 361-362 (1979).

OPTICAL APPARATUS USING WAVELENGTH SELECTIVE PHOTOCOUPLER

This application is a continuation, of application Ser. No. 07/491,203 filed Mar. 9, 1990, now abandoned.

BACKGROUND OF THE INVENTION

1. Field of the Invention

The present invention relates to an optical apparatus such as a photosensor, a semiconductor laser, an optical amplifier, or the like, using a wavelength selective photocoupler which is constituted by coupling two waveguides through a diffraction grating.

2. Related Background Art

A conventional wavelength selective photocoupler is constituted by two optical waveguides formed on a single substrate, as described in, e.g., Applied Physics Letters, R. C. Alferness, et al. 33, p. 161 (1978), Japanese Patent Laid-Open No. 61-250607, or Study Reports OQE81-129, the Institute of Electronics and Communications Engineers of Japan. FIG. 1 is a schematic perspective view showing a structure of a conventional wavelength selective photocoupler.

In FIG. 1, two optical waveguides 81 and 82 are formed to have different line widths, heights, and the like, and hence, have different propagation constants of guided light beams propagating along the corresponding optical waveguides. In this case, a diffraction grating 83 for compensating for a difference between the propagation constants is formed on one of regions where electric field distributions of the two guided light beams are present, so that photocoupling between the two waveguides occurs with respect to a guided light component in a specific wavelength range. More specifically, only a light component in a specific wavelength range is selected to shift a light power between the waveguides.

Such a conventional photocoupler is applied to a wavelength selective filter for combining/dividing signal light and a light wave of a specific wavelength, and a photosensor for receiving a light wave of a specific wavelength.

However, in the conventional photocoupler, since the waveguides are formed on a single plane, a difference between the propagation constants of the two waveguides can only be controlled by line widths, heights, and the like of the waveguides, and a large propagation constant difference cannot be obtained. For this reason, an optical power shift operation between the two waveguides is caused not only by the diffraction grating but also by an interference effect of two guided light beams. Therefore, it is difficult to obtain sharp wavelength selectivity.

In the photocoupler described above, a direction of causing a power shift corresponds not to a direction of strongly confining guided light, i.e., a direction perpendicular to the substrate but to a planar direction with a relatively loose confinement effect. Therefore, a coupling length of a coupling region must be set as large as 3 to 15 mm. This coupling length makes the entire element large in size, and disturbs the manufacture of an element utilizing waveguides formed of a material which cannot neglect absorption.

In order to further change the width and height of the waveguide, a photolithographic technique is required. However, it is very difficult to attain precision of 1 μm or less in the manufacture, resulting in poor reproducibility of elements and impairing element characteristics.

A wavelength selective photocoupler which can solve the above problems is proposed in Integrated and Guided-Wave Optics, R.C. Alferness et al., 1989, technical digest series vol. 4, pp. 215-218. In this photocoupler, two waveguide layers of different guided modes are stacked on a substrate, and are optically coupled through a diffraction grating.

SUMMARY OF THE INVENTION

It is an object of the present invention to provide an optical apparatus using a photocoupler of a vertical structure, which has sharp wavelength selectivity, and can decrease a light amount loss.

In order to achieve the above object of the present invention, there is provided a photosensor comprising:
 a substrate;
 a first waveguide layer formed on the substrate;
 a second waveguide layer formed on the first waveguide layer to be stacked in a direction of thickness, the second waveguide layer having a guided mode different from that of the first waveguide layer;
 a diffraction grating formed on an overlapping region of the guided modes of the first and second waveguide layers, the diffraction grating coupling light components of a specific wavelength range of light propagating through the first waveguide layer to the second waveguide layer;
 a light absorption layer for absorbing at least some light components of the light components coupled to the second waveguide layer; and
 an electrode for converting the light components absorbed by the light absorption layer into an electrical signal and outputting the electrical signal.

In order to achieve the above object of the present invention, there is provided a semiconductor laser comprising:
 a substrate;
 a first waveguide layer formed on the substrate and including a laser active layer, the laser active layer emitting a laser beam upon injection of a current;
 an electrode for supplying a current to the laser active layer;
 a second waveguide layer formed on the first waveguide layer to be stacked in a direction of thickness, the second waveguide layer having a guided mode different from that of the first waveguide layer; and
 a diffraction grating formed on an overlapping region of the guided modes of the first and second waveguide layers, the diffraction grating coupling the laser beam emitted from the laser active layer to the second waveguide layer.

In order to achieve the above object of the present invention, there is provided an optical amplifier comprising:
 a substrate;
 a first waveguide layer formed on the substrate;
 a second waveguide layer formed on the first waveguide layer to be stacked in a direction of thickness, the second waveguide layer having a guided mode different from that of the first waveguide layer;
 a diffraction grating formed on an overlapping region of the guided modes of the first and second waveguide layers, the diffraction grating optically coupling the first and second waveguide layers in a specific wavelength range;

a laser active region formed on at least a portion of the second waveguide layer, the laser active region amplifying light propagating through the second waveguide layer upon supply of a current; and an electrode for supplying a current to the laser active region.

DETAILED DESCRIPTION OF THE PREFERRED EMBODIMENTS

Figure 1:
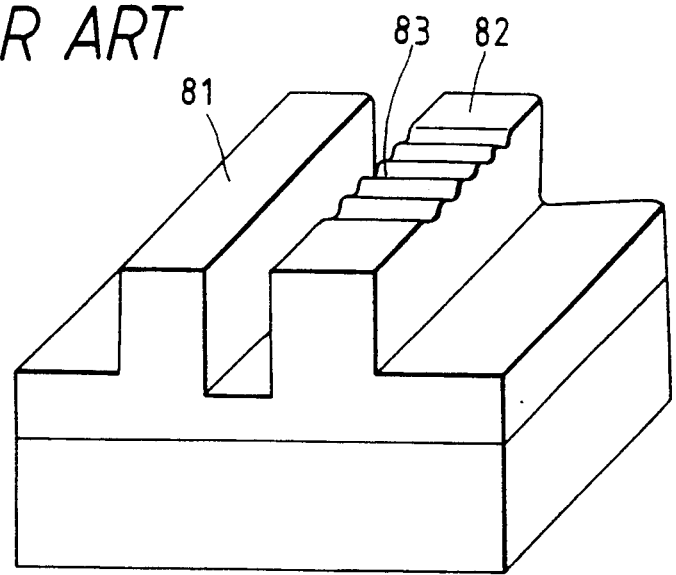
FIG. 1 is a schematic perspective view showing a structure of a conventional wavelength selective photocoupler.
Figure 2:
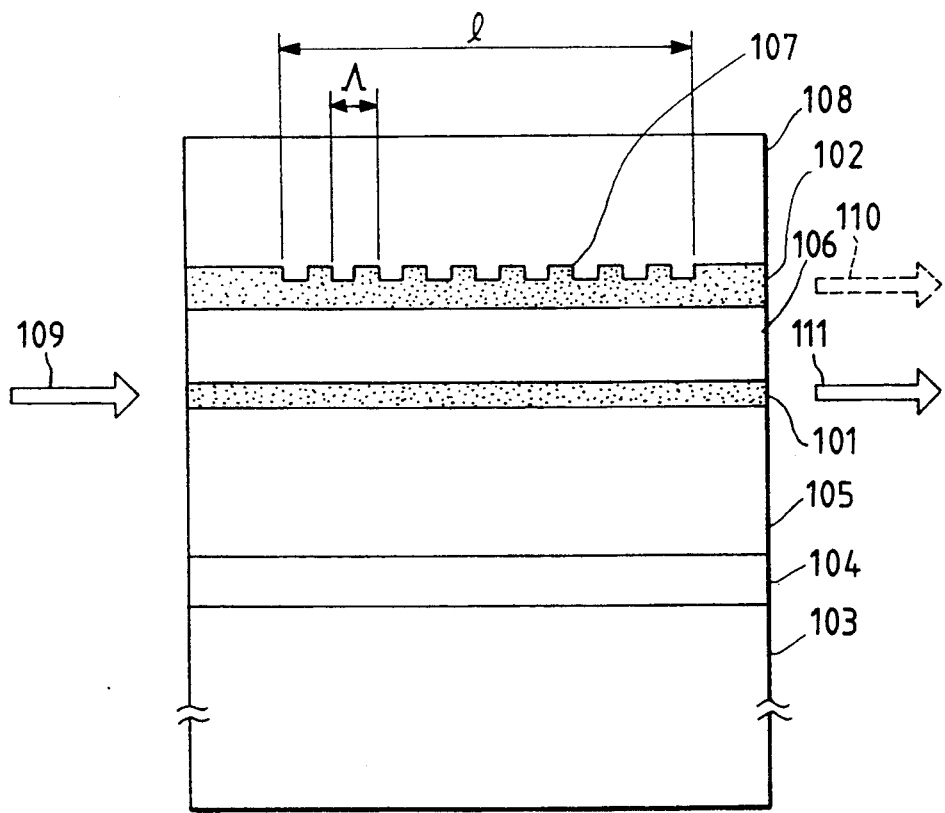
FIG. 2 is a schematic sectional view showing a basic structure of a wavelength selective photocoupler used in the present invention.

FIG. 2 is a schematic sectional view showing a basic structure of a wavelength selective photocoupler used in the present invention. In FIG. 2, a 0.5-$\mu$m thick GaAs buffer layer 104, a 1.5-$\mu$m thick Al$_{0.5}$Ga$_{0.5}$As cladding layer 105, a 0.2-$\mu$m thick first waveguide layer 101 in which GaAs and Al$_{0.5}$Ga$_{0.5}$As layers are alternately stacked to constitute a multi-quantum well (MQW), a 0.7-$\mu$m thick Al$_{0.5}$Ga$_{0.5}$As cladding layer 106, and a 0.45-$\mu$m thick second waveguide layer 102 in which GaAs and A1$_{0.4}$Ga$_{0.6}$As layers are alternately stacked to constitute an MQW are sequentially grown on a GaAs substrate 103 by a molecular beam expitaxial (MBE) method A diffraction grating 107 consisting of 0.2-$\mu$m deep corrugations is formed on a portion of the upper surface of the second waveguide layer 102. The diffraction grating 107 is formed by using reactive ion beam etching (RIBE) after a resist mask is formed. An A1$_{0.5}$Ga$_{0.5}$As cladding layer 108 is regrown on the diffraction grating 107 by a liquid-phase epitaxial (LPE) method.

In this manner, in FIG. 2, the waveguide layers (first and second waveguide layers 101 and 102) are stacked in a direction of thickness to constitute a directive coupler. Since the waveguide layers 101 and 102 are formed to have different thicknesses and compositions, light beams propagating through these layers have different propagation constants. The diffraction grating 107 formed on the second waveguide layer 102 is used to select a wavelength to be optically coupled, and its pitch determines a wavelength range to be selected.

Figure 3:
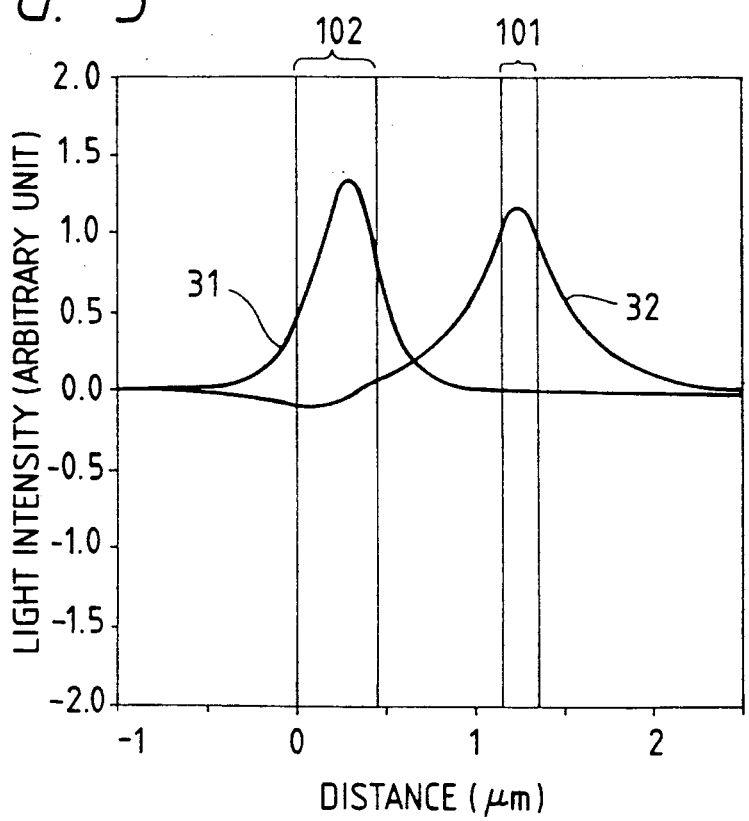
FIG. 3 is a graph showing light intensity distributions of guided modes of the photocoupler shown in FIG. 2.

FIG. 3 shows photoelectric field distributions of guided modes of the photocoupler shown in FIG. 2. A light intensity is plotted along the ordinate, and a distance with reference to the first waveguide layer 101 is plotted along the abscissa. In this embodiment, the guided modes include an odd mode 32 established to have the central intensity in the first waveguide layer 101, and an even mode 31 established to have the central intensity in the second waveguide layer 102. The diffraction grating 107 is formed on an overlapping portion of the even and odd modes 31 and 32.

The operation of the photocoupler shown in FIG. 2 having the two waveguide layers will be described below.

Input light 109 consisting of a plurality of laser beam components having wavelengths of 0.8 $\mu$m to 0.86 $\mu$m in units of 0.01 $\mu$m is input and coupled to the first waveguide layer 101. The modes established in the two waveguide layers include the odd and even modes 31 and 32, described above. Light input to the first waveguide layer 101 is coupled to the odd mode 32 having the central intensity in the first waveguide layer 101, and propagates therethrough. In this case, in a region without the diffraction grating 107, since the odd and even modes 32 and 31 have different propagation constants, light beam components are not almost coupled and propagate almost independently. However, in a region with the diffraction grating, optical power shift occurs if the following function is established between a propagation constant $\beta_0$ of the odd mode 32 and a propagation constant $\beta_1$ of the even mode 31:

$$\beta_1(\lambda) - \beta_0(\lambda) = \frac{2\pi}{\Lambda} \quad (1)$$

where $\lambda$ is the light wavelength, and $\Lambda$ is the pitch of the diffraction grating.

When the optical power shift described above occurs, guided light of the odd mode 32 coupled to the input light 109 is converted to guided light of the even mode 31. Therefore, input light is finally converted to a light wave propagating through the second waveguide layer, and is output as selected output light 110. Light beam components of other wavelengths are directly output as non-selected output light 111. A region length l of the diffraction grating for causing perfect coupling is given by:

$$l = \frac{\pi}{2g} \quad (2)$$

$$g = \int \epsilon_1 A_1(x) \epsilon_0 dx$$

where $\epsilon_1$ and $\epsilon_0$ respectively represent photoelectric field intensity distributions of the even and odd modes 31 and 32, and $A_1(x)$ is a component corresponding to 1st-order diffracted light of the Fourier expansion of the diffraction grating.

In order to perform wavelength filtering to have light of a wavelength of 0.83 μm as a central wavelength, $\Lambda = 9$ μm from equation (1), and the perfect coupling length $l = 250$ μm from equation (2).

Figure 4:
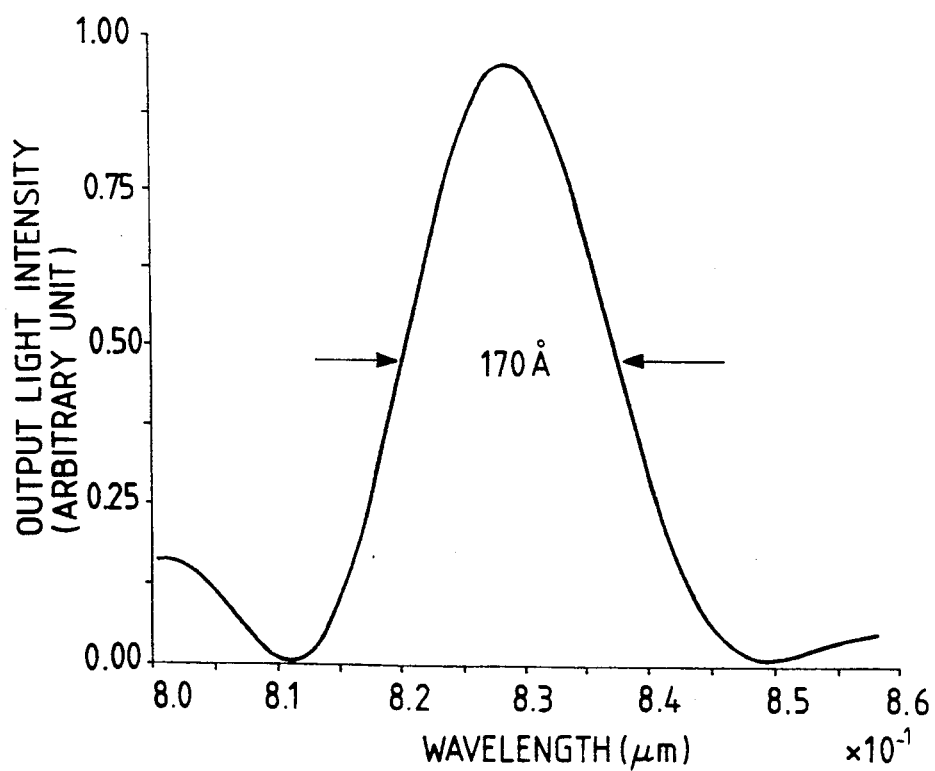
FIG. 4 is a graph showing wavelength characteristics of light emerging from the photocoupler shown in FIG. 2.

As a result, of light components input to the first waveguide layer 101, the wavelength characteristics of the selected output light 110 output from the second waveguide layer 102 are as shown in FIG. 4. As can be seen from FIG. 4, wavelength filtering of a full width at half maximum of about 170 Å is performed. The wave combination is also similarly performed, as a matter of course. Note that non-reflection coating is applied to incident/exit end faces to reduce end face reflection.

Figure 5:
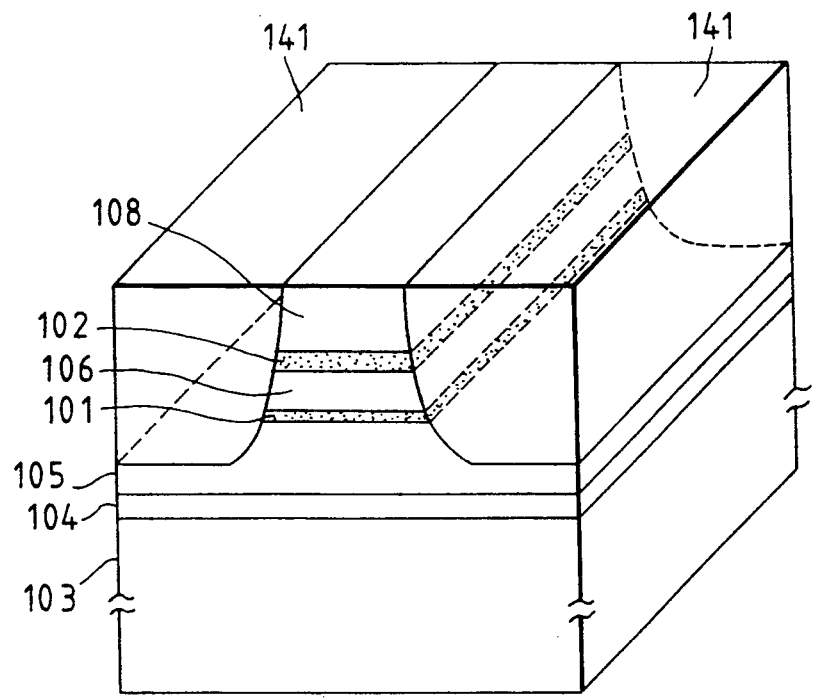
FIGS. 5 and 6 are schematic views showing other structures of wavelength selective photocouplers used in the present invention.

FIG. 5 is a schematic perspective view showing another structure of a photocoupler used in the present invention. FIG. 2 exemplifies a slab type structure which does not perform lateral optical confinement. However, in FIG. 5, lateral optical confinement is performed to reduce a light loss. The same reference numerals in FIG. 5 denote the same parts as in FIG. 2, and a detailed description thereof will be omitted.

Referring to FIG. 5, in order to perform lateral optical confinement, an impurity such as Zn (or Si) is thermally diffused in the upper surface of the cladding layer 108 to disorder the two side portions of the first and second waveguide layers 101 and 102, thereby forming low-refraction regions 141 having a low refractive index. Other structures are the same as those in FIG. 2.

Guided light beams in the first and second waveguide layers 101 and 102 are confined in the lateral direction by the low-refraction regions 141, and a loss caused by diffraction divergence of guided light can be reduced, thus obtaining a light wavelength filter having high efficiency.

Lateral confinement can be attained by various other methods, such as a method of forming ridges, an embedding method, a loading method, and the like.

Figure 6:
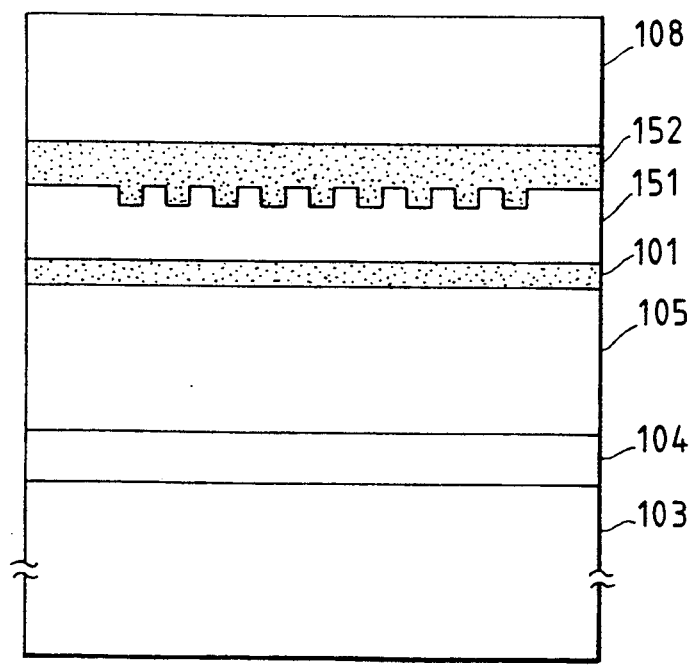

FIG. 6 is a schematic sectional view showing still another structure of a photocoupler used in the present invention. The same reference numerals in FIG. 6 denote the same parts as in FIG. 2, and a detailed description thereof will be omitted.

In the structure shown in FIG. 2, the diffraction grating for compensating for a propagation constant difference between the two waveguide layers is formed in the second waveguide layer 102. In the structure shown in FIG. 6, the diffraction grating is formed in a cladding layer between the two waveguide layers. More specifically, as shown in FIG. 6, after an AlGaAs cladding layer 151 is formed, a corrugated diffraction grating is formed thereon by the photolithographic method, and an AlGaAs second waveguide layer 152 and an AlGaAs cladding layer 108 are regrown thereon. Other structures are the same as those in FIG. 2. The performance of the element in FIG. 6 is not so different from that of FIG. 2. With these variations, a suitable element shape can be selected when a photocoupler is combined with another element or is formed as an integrated circuit. As described above, the formation position of the diffraction grating can be arbitrarily selected as long as both the photoelectric field distributions of guided light (the even and odd modes 31 and 32) are present there. In this case, coupling efficiency varies accordingly, and a coupling length must be adjusted.

Figure 7:
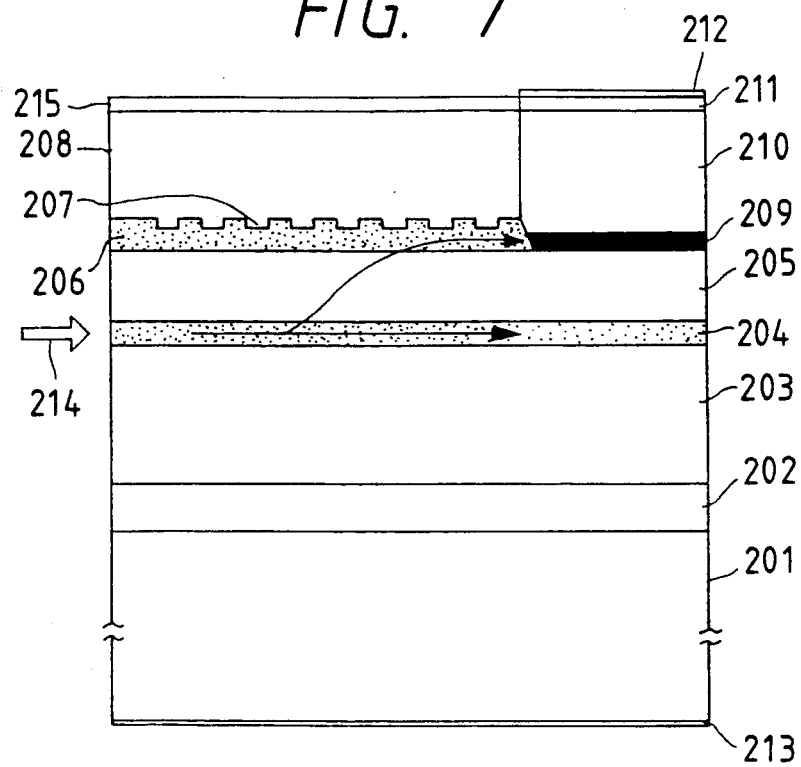
FIG. 7 is a schematic sectional view showing the first embodiment in which the present invention is applied to a photosensor.

FIG. 7 is a schematic sectional view showing the first embodiment of a photosensor using the above-mentioned wavelength selective photocoupler.

The manufacturing process of this embodiment will be described below with reference to FIG. 7.

A 0.5-μm thick n-GaAs buffer layer 202, a 1.5-μm thick n-Al$_{0.5}$Ga$_{0.5}$As cladding layer 203, a 0.2-μm thick n-Al$_{0.3}$Ga$_{0.7}$As first waveguide layer 204, a 0.8-μm thick n-Al$_{0.5}$Ga$_{0.5}$As cladding layer 205, and a 0.4-μm thick second waveguide layer 206 in which an MQW was constituted by alternately stacking i-GaAs and Al$_{0.4}$Ga$_{0.6}$As layers were sequentially grown on an n$^+$-GaAs substrate 201 by the MBE method. Thereafter, a diffraction grating 207 consisting of corrugations each having a depth of 0.05 μm and a pitch of 7.7 μm was formed on the upper surface of the second waveguide layer 206 by the photolithographic method to have a length of 1.277 mm. An i-Al$_{0.5}$Ga$_{0.5}$As cladding layer 208, and a 0.5-μm thick i-GaAs capping layer 215 were regrown on the resultant structure by the LPE method. Thereafter, the cladding layer 208 and the second waveguide layer 206 in a region adjacent to the diffraction grating 207 were removed by etching. A 0.1-μm thick i-GaAs absorption layer 209, a 1.2-μm thick p-Al$_{0.5}$Ga$_{0.5}$As cladding layer 210, and a 0.5-μm thick p$^+$-GaAs capping layer 211 were regrown on the removed portion by the LPE method. A Cr/Au electrode 212 was formed on the capping layer 211, and an AuGe/Au electrode 213 was formed on the rear surface of the substrate 201.

In the structure of this embodiment, of light 214 input to the first waveguide layer 204, only light components having wavelengths selected by a light wavelength filter are coupled to the second waveguide layer 206, and are absorbed by the absorption layer 209 serving as a photosensor unit. The photosensor unit has a p-i-n structure, and a reverse bias voltage is applied across the electrodes 212 and 213. For this reason, carriers produced by absorption are detected as current signals.

Figure 8:
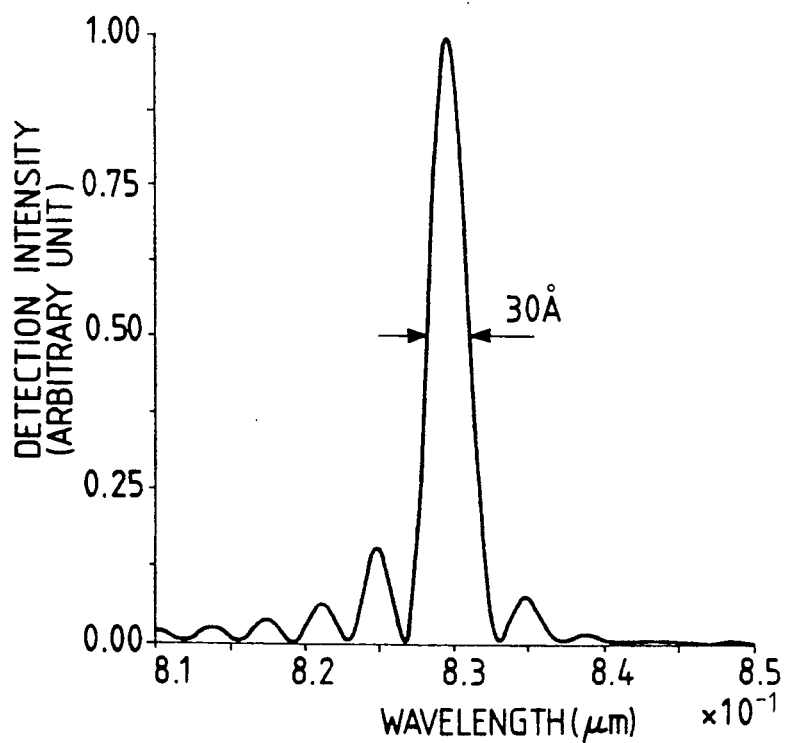
FIG. 8 is a graph showing wavelength characteristics of light detected by the photosensor shown in FIG. 7.

FIG. 8 is a graph showing wavelength characteristics of signal line extracted as an electrical signal in the photosensor of this embodiment.

In this embodiment, since the depth of each corrugation is set to be small, and a distance between the two waveguide layers is set to be large, a large coupling length is attained. However, a wavelength selection width is as small as about 30 Å.

Figure 9:
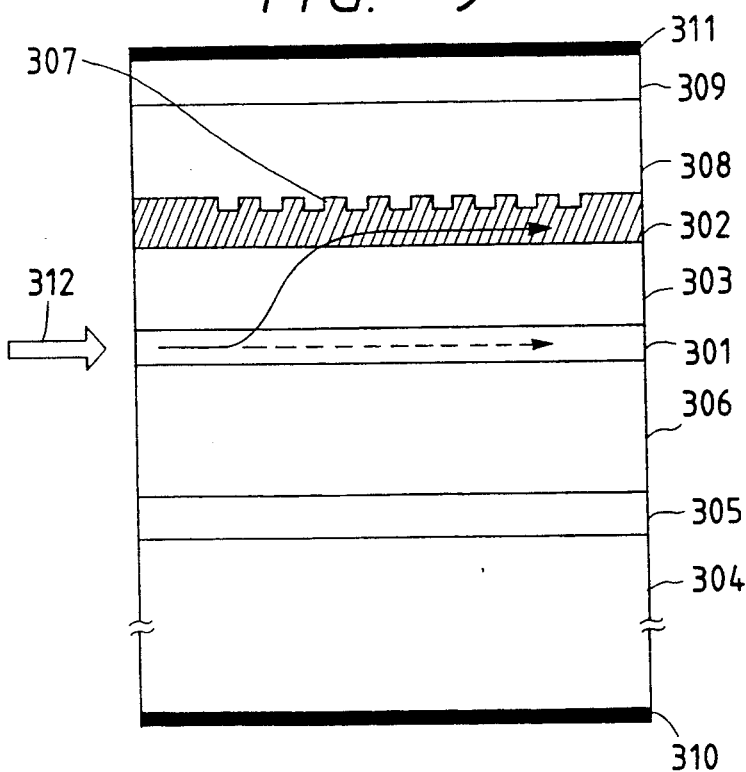
FIG. 9 is a schematic sectional view of the second embodiment in which the present invention is applied to a photosensor.

FIG. 9 is a schematic sectional view showing the second embodiment in which the present invention is applied to a photosensor.

In this embodiment, a 0.5-μm thick n-GaAs buffer layer 305, a 1.5-μm thick n-Al$_{0.5}$Ga$_{0.5}$As cladding layer 306, a waveguide layer 301 in which 30-Å thick n-GaAs layers and 70-Å thick Al$_{0.5}$Ga$_{0.5}$As layers are alternately stacked to constitute a 0.2-μm thick MQW as a whole, a 0.7-μm thick n-Al$_{0.5}$Ga$_{0.5}$As cladding layer 303, and a 0.4-μm thick i-GaAs light absorption layer 302 are sequentially grown on an n$^+$-GaAs substrate 304 by the MBE method.

A diffraction grating 307 consisting of corrugations having a depth of 0.2 μm and a pitch of 5.5 μm is formed on the upper surface of the light absorption layer 302 to have a length of 100 μm by etching using ammonia and hydrogen peroxide after a resist mask is formed by the photolithographic method using a photoresist.

A p-Al$_{0.5}$Ga$_{0.5}$As cladding layer 308 and a p$^+$-GaAs capping layer 309 are grown on the resultant structure by the LPE method. An Au-Ge contact layer (not shown), and an Au electrode 310 are formed on the rear surface of the substrate 304. A Cr contact layer (not shown), and an Au electrode 311 are formed on the upper surface of the capping layer 309. In this manner, a p-i-n type photodiode is formed.

With the above-mentioned structure of the photosensor of this embodiment, the waveguide layer 301 and the light absorption layer 302 stacked in a direction of thickness form a directive coupler. The waveguide layer 30 and the light absorption layer 302 have different compositions and layer thicknesses, so that propagation constants of light beams propagating therethrough are different from each other. The diffraction grating 307 formed on the upper surface of the light absorption layer 302 selects directly coupled light according to its grating pitch.

Photoelectric field intensity distributions of the even and odd modes 31 and 32 established in the photosensor of this embodiment are the same as those shown in FIG. 3. The waveguide layer 301 of this embodiment corresponds to the above-mentioned first waveguide layer 101, and the light absorption layer 302 corresponds to the above-mentioned second waveguide layer 102.

The operation of this embodiment will be described below.

A reverse bias voltage is kept applied across the electrodes 310 and 311, and signal light 312 consisting of a plurality of laser beam components of wavelengths 0.81 μm to 0.87 μm in units of 0.01 μm is incident on the waveguide layer 301 using end face coupling. The input coupled signal light 312 is converted to the odd mode, having the central intensity in the waveguide layer 301, of the even and odd modes shown in FIG. 3, and propagates through the layer 301. Since the photoelectric field intensity distribution of the odd mode does not almost influence the light absorption layer 302, a propagation loss caused by absorption is very small.

Figure 10:
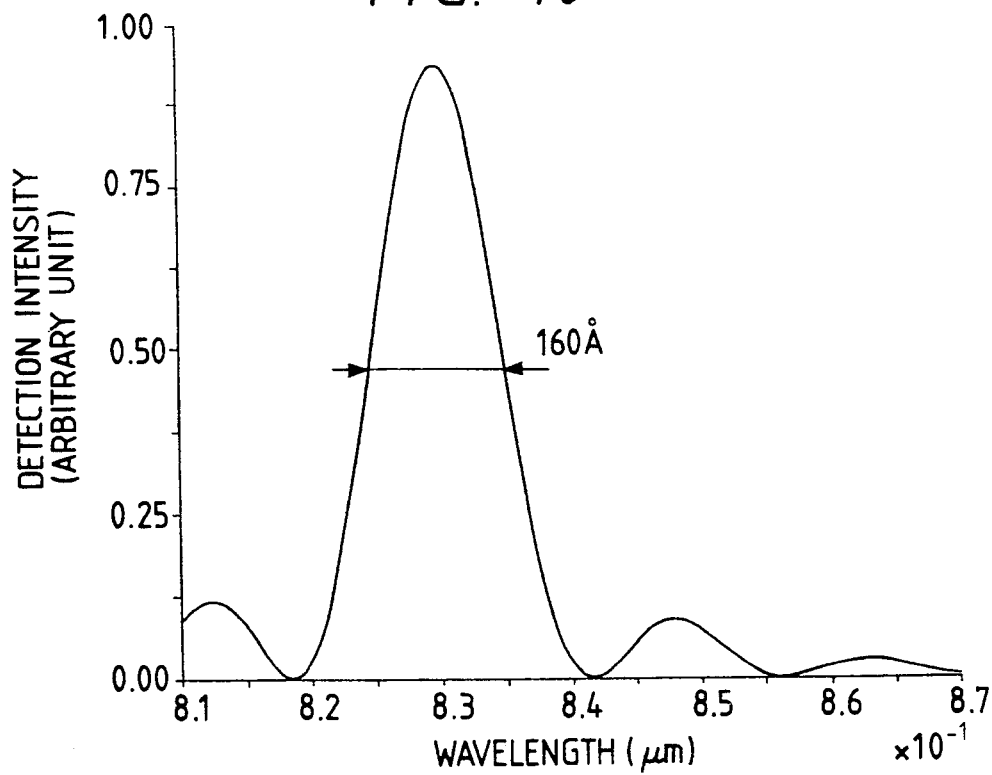
FIG. 10 is a graph showing wavelength characteristics of light detected by the photosensor shown in FIG. 9.

Since the even mode having the central intensity in the light absorption layer 302 has a propagation constant different from that of the odd mode, these two modes are not almost coupled to each other. However, if the relationship given by equation (1) is satisfied in a region with the diffraction grating, light of the odd mode is converted to that of the even mode, and the central intensity is shifted to the light absorption layer 302. In this embodiment, the grating pitch Λ is set to be 5.5 μm, and a wavelength of 0.83 μm is detected. The guided light shifted to the light absorption layer 302 is absorbed to cause electrons and holes to be detected as a photoelectric current. FIG. 10 shows a wavelength distribution of detected light. As can be understood from FIG. 10, sharp wavelength selection of a full width at half maximum of 160 Å is performed. In this embodiment, the region of the diffraction grating is set to have a length of 100 μm which does not reach the perfect coupling length (the length of a coupling region for maximizing coupling efficiency) of 262 μm as a directive coupler using the diffraction grating. Such setup is made in consideration of a response time of a photosensor. If an increase in response time caused by an increase in light-receiving area is allowed, the length of the diffraction grating region is set to be approximate to the perfect coupling length, thus further increasing absorption efficiency.

If a plurality of elements according to the present invention are serially connected to have different pitches, an integrated photosensor capable of simultaneously detecting signal light beams having a plurality of wavelengths can be manufactured.

Figure 11:
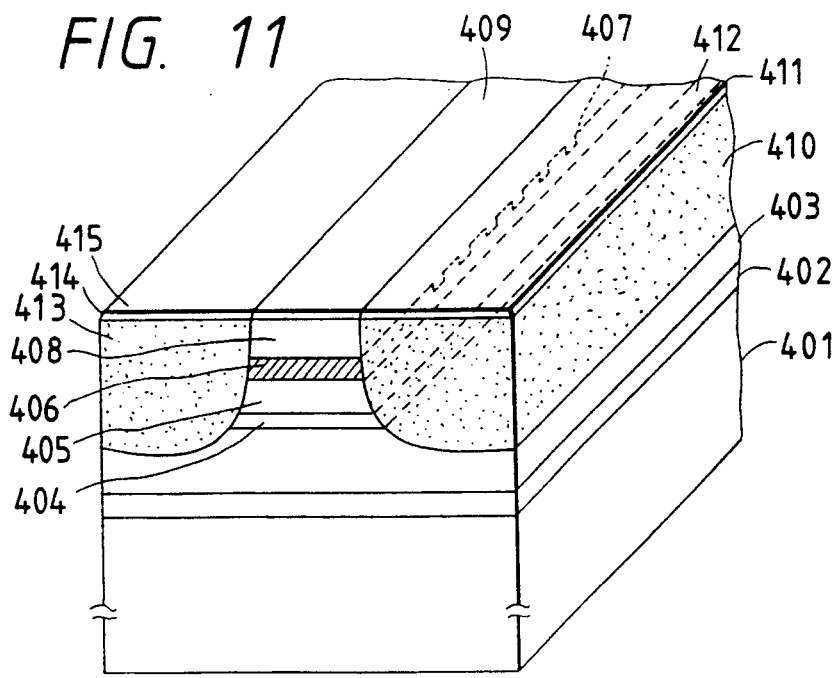
FIG. 11 is a schematic sectional view of the third embodiment in which the present invention is applied to a photosensor.

FIG. 11 is a schematic perspective view showing a structure of the third embodiment of a photosensor according to the present invention.

In this embodiment, light detection is performed by a laterally formed p-i-n structure.

This embodiment was manufactured as follows. That is, a 0.5-μm thick i-GaAs buffer layer 402, a 1.5-μm thick i-Al$_{0.5}$Ga$_{0.5}$As cladding layer 403, a 0.2-μm waveguide layer 404 in which 50-Å thick i-GaAs and Al$_{0.5}$Ga$_{0.5}$As layers were alternately stacked to constitute an MQW, a 0.75-μm thick i-Al$_{0.5}$Ga$_{0.5}$As cladding layer 405, and a 0.3-μm thick i-GaAs light absorption layer 406 were sequentially grown on a semi-insulating GaAs substrate 401. A diffraction grating 407 consisting of 0.05-μm deep corrugations was formed on the upper surface of the light absorption layer 406 following the same procedures as in the second embodiment shown in FIG. 9. The pitch of the corrugations was 4.6 μm, and the length of the region was 200 μm. Thereafter, a 1.5-μm thick i-Al$_{0.5}$Ga$_{0.5}$As cladding layer 408 was grown on the resultant structure, and an Si$_3$N$_4$ protective layer 409 was formed thereon.

Zn and Si were thermally diffused in two side portions of the upper surface of the protective layer 409 at an interval of 2 μm, thereby forming p- and n-type regions 410 and 413. Thereafter, a p$^+$-GaAs capping layer 411, and a Cr/Au electrode 412 were formed on the upper portion of the p-type region 410. An n$^+$-GaAs capping layer 414 and an Au-Ge/Au electrode 415 were formed on the upper portion of the n-type region 413.

Figure 12:
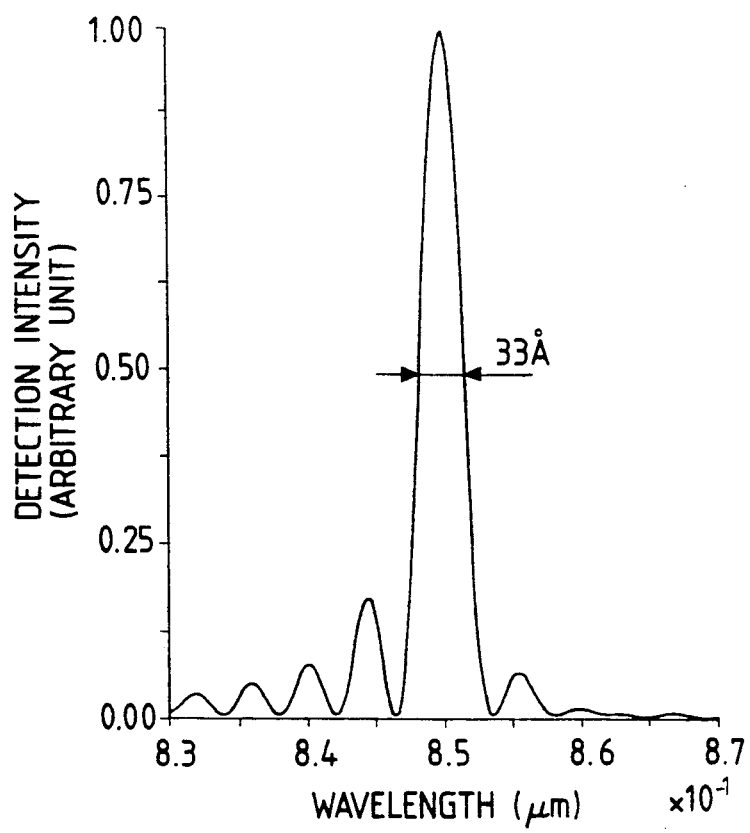
FIG. 12 is a graph showing wavelength characteristics of light detected by the photosensor shown in FIG. 11.

Wavelength characteristics of a detection intensity with respect to input light were observed in the same manner as in the second embodiment while a reverse bias voltage was applied to the lateral p-i-n structure. As a result, as shown in FIG. 12, good wavelength selectivity as in the second embodiment could be obtained. The full width at half maximum was about 33 Å.

Since the structure of this embodiment employs a semi-insulating substrate, it allows easy electrical isolation from other elements, and is advantageous when a plurality of photosensors are integrated, or this embodiment is integrated with a detection amplifier, a light-emitting element, or a control driver.

Figure 13:
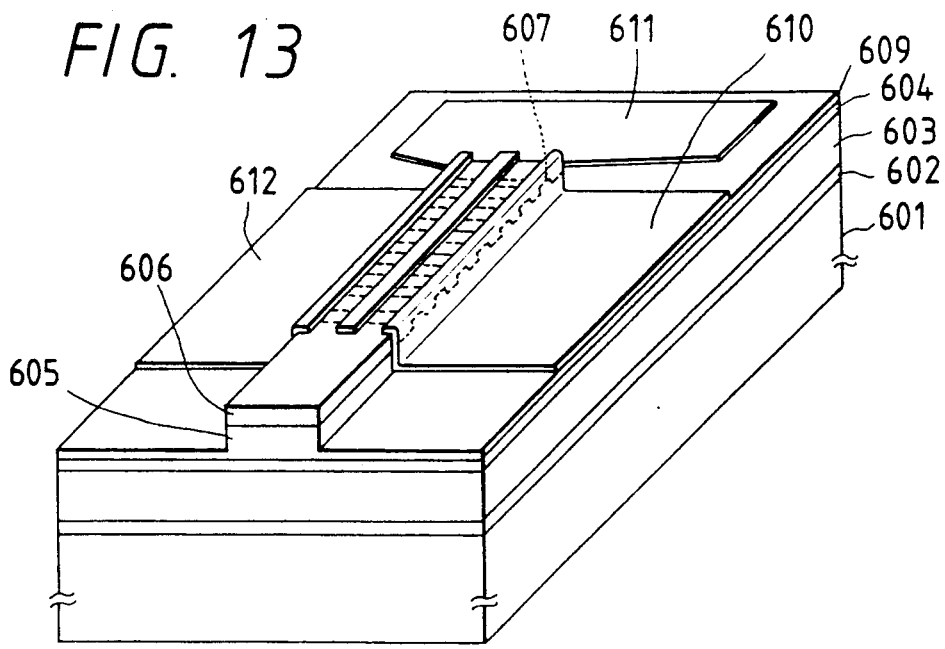
FIG. 13 is a schematic sectional view of the fourth embodiment in which the present invention is applied to a photosensor.

FIG. 13 is a schematic perspective view showing a structure of the fourth embodiment of a photosensor according to the present invention.

This embodiment can provide an amplification function by an FET structure as well as the wavelength division detection function.

The structure of this embodiment will be described below.

A 0.5-μm thick i-GaAs buffer layer 602, a 1.5-μm thick i-Al$_{0.5}$Ga$_{0.5}$As cladding layer 603, a 0.2-μm thick waveguide layer 604 having the same structure as that of the waveguide layer 404 in the third embodiment, and a 0.6-μm thick i-Al$_{0.5}$Ga$_{0.5}$As cladding layer 605 are sequentially formed on a semi-insulating GaAs substrate 601 by the MBE method as in the third embodiment. A corrugated diffraction grating 607 is formed on the upper surface of the resultant structure as in the second and third embodiments. A 0.4-μm thick n-GaAs light absorption layer 606 (doping concentration = $1 \times 10^{17}$ cm$^{-3}$) is then regrown. Thereafter, a 0.3-μm thick Si$_3$N$_4$ insulating film 609 is formed by sputtering.

As shown in FIG. 13, a source electrode 610, a gate electrode 611, and a drain electrode 612 are formed on the light absorption layer 606, thus constituting an FET structure. The source and drain electrodes 610 and 612 comprise Au electrodes having an Au-Ge layer as an underlying layer, and the gate electrode 611 is formed of Al.

The operation of this embodiment is the same as that of the above embodiment. Light incident on the waveguide layer 604 is mode-converted in the diffraction grating region, and is absorbed by the light absorption layer 606. Carriers produced as a result of absorption are amplified, and are detected as drain currents.

In this embodiment, since the amplification function by the FET structure is added to the wavelength detection function, a photosensor having high detection sensitivity can be obtained.

Figure 14:
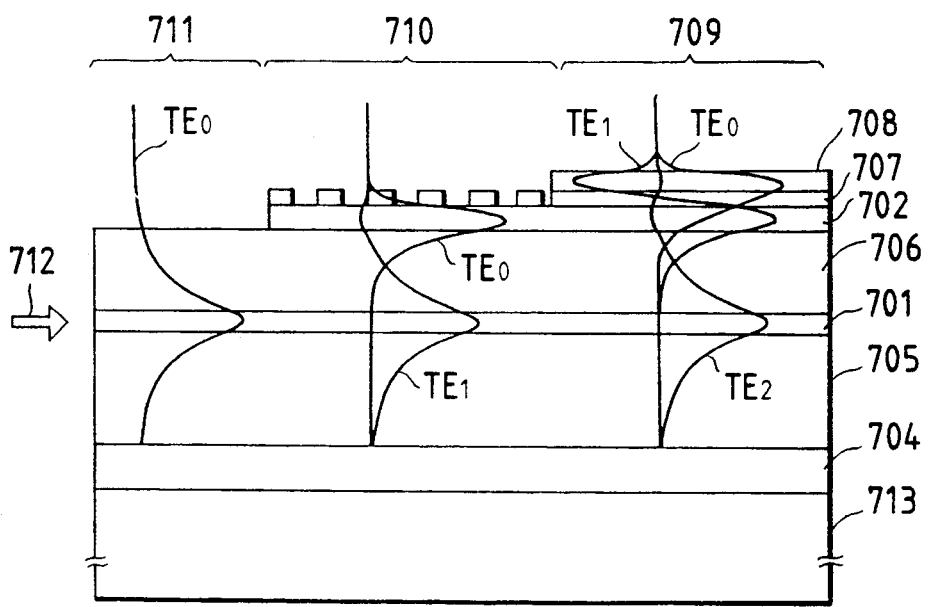
FIGS. 14 to 15B are schematic views of the fifth embodiment in which the present invention is applied to photosensors.
Figure 15A:
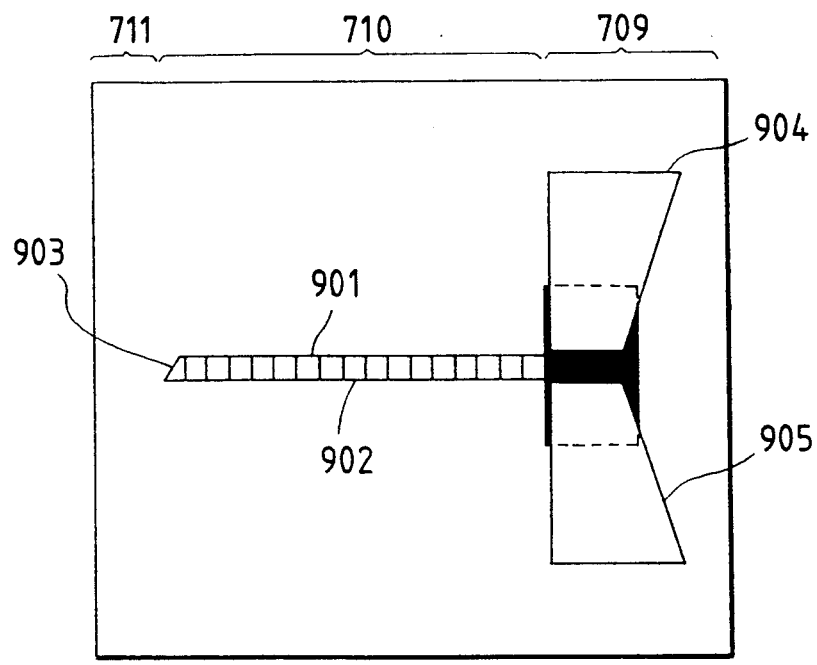

FIG. 14 is a schematic sectional view showing the structure of the fifth embodiment of a photosensor according to the present invention, and FIG. 15A is a plan view showing the structure of an electrode formed on the upper surface of the fifth embodiment.

The manufacturing method of this embodiment will be described below.

A 0.5-μm thick GaAs buffer layer 704, a 1.5-μm thick Al$_{0.5}$Ga$_{0.5}$As cladding layer 705, a 0.15-μm thick first waveguide layer 701 in which GaAs and Al$_{0.4}$Ga$_{0.6}$As layers were alternately stacked to constitute an MQW, a 1.1-μm thick Al$_{0.5}$Ga$_{0.5}$As cladding layer 706, 0.2-μm thick second waveguide layer 702 in which GaAs and Al$_{0.2}$Ga$_{0.8}$As layers were alternately stacked to constitute an MQW, a 0.25-μm thick Al$_{0.4}$Ga$_{0.6}$As diffraction grating layer 707, and a 0.25-μm thick n-GaAs (n = $1 \times 10^{17}$ cm$^{-3}$) light detection layer 708 were sequentially grown on a GaAs substrate 713 by the MBE method. A resist mask was formed on the resultant structure by the photolithographic method using a photoresist, and thereafter, the structure was subjected to selective etching using an etchant mixture of ammonia and hydrogen peroxide solutions, thereby removing the light detection layer 708 to leave a light detection region 709 as a right-hand side portion in FIG. 14. In this case, since the Al$_{0.4}$Ga$_{0.6}$As diffraction grating layer 707 is present under the light absorption region 709, selective etching depending on properties of Al can be easily performed.

A resist mask was formed again, and a ridge waveguide 901, extending from the light detection region 709 to an introduction region 711, for confining guided light was formed by RIBE, as shown in FIG. 15A. A diffraction grating 902 having a pitch of 30 μm and a region length of 550 μm was formed to be perpendicular to the longitudinal direction of the ridge waveguide 901 following the same procedures as for the waveguide 901. The diffraction grating 902 is formed by etching the Al$_{0.4}$Ga$_{0.6}$As diffraction grating layer 707. Therefore, the depth of the diffraction grating is 0.25 μm.

Figure 15B:
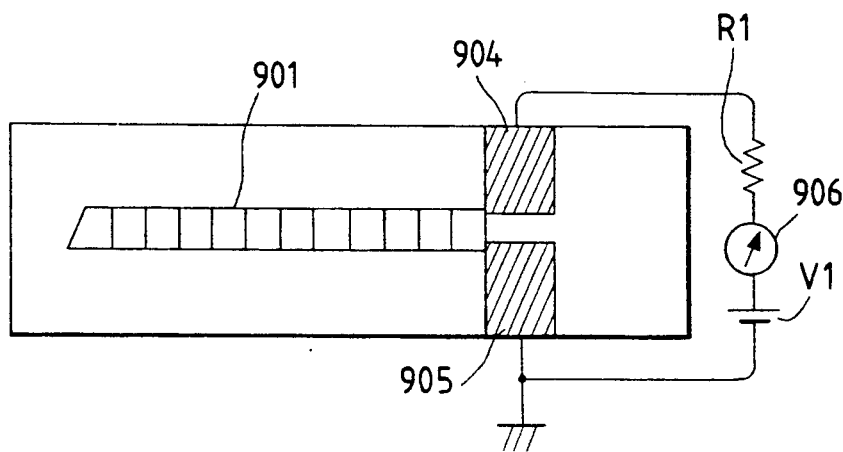

A portion of the second waveguide layer 702 in front of the ridge waveguide 901 was removed by etching so that only the first waveguide layer 701 was coupled to light upon input of light (FIG. 14). In this case, a ridge end face 903 was obliquely etched with respect to the longitudinal direction of the ridge waveguide 901, as shown in FIGS. 15A and 15B to further reduce an opportunity of coupling to the second waveguide layer 702.

A 0.3-μm thick Si$_3$N$_4$ film was formed on the upper surface of the resultant structure by plasma CVD (chemical vapor deposition). A resist mask for forming an electrode window in a portion of the light detection region 709 (FIG. 15A) was formed, and a portion of the Si$_3$N$_4$ film was removed by dry etching using the mask. An Au/Au-Ge electrode film was then formed, and two electrodes 904 and 905 contacting the light detection layer 708 (FIG. 14) were formed by the photolithographic method, as shown in FIG. 15A. These two electrodes 904 and 905 are arranged to oppose each other to be perpendicular to the longitudinal direction of the ridge waveguide 901, so that wavelength-selected guided light is coupled in the light detection layer 708 under a portion between the electrodes 904 and 905. The electrode length in a light propagation direction is 100 μm in this embodiment.

The length of a wavelength selection region 710 corresponds to that of the diffraction grating 902, and is 550 μm in this embodiment. The length of the light detection region 709 corresponds to that of the electrode, and is 100 μm in this embodiment.

After the element prepared in the above process was cut, and the cut element was fixed to a sample holder, and lead wires were bonded to the electrodes 904 and 905 to be extracted to the outside.

In this manner, in the photosensor of this embodiment, the three waveguide layers (the first waveguide layer 701, the second waveguide layer 702, and the light detection layer 708) are stacked in the direction of thickness, thereby constituting a directive coupler. Since the waveguide layers 701 and 702 and the light detection layer 708 are formed to have different thicknesses and compositions, light beams propagating through these layers have different propagation constants. The diffraction grating 902 formed on the second waveguide layer 702 is used to select a wavelength to be optically coupled, and its pitch determines a wavelength range to be selected.

Since the light detection layer 708 is formed on the second waveguide layer 702 in the light detection region 709, light of a selected wavelength is absorbed, and carriers are produced accordingly. For this reason, since a resistance between the electrodes 904 and 905 is decreased according to the number of carriers produced by photoconductivity, this decrease can be detected to detect light of the selected wavelength.

Note that $TE_0$ to $TE_2$ in FIG. 14 represent photoelectric field intensity distributions in corresponding regions, and indicate light intensities in the propagation direction of guided light.

Since different semiconductor layers are stacked in the regions 709 to 711 of this embodiment, different guided modes are established.

In the light introduction region 711, only a substrate mode, i.e., $TE_0$ mode is established. In the wavelength selection region 710, an even mode ($TE_0$) mode having the central intensity in the second waveguide layer 702, and an odd mode ($TE_1$) mode having the central intensity in the first waveguide layer 701 are established.

In the light detection region 709, two or more modes are established depending on its multilayered structure. As shown in FIG. 14, $TE_0$, $TE_1$, and $TE_2$ are established. Guided light of each mode is absorbed by the light detection layer, as described above. An absorption coefficient in this case largely varies depending on the degree of influence of a photoelectric field intensity distribution of each mode to the light detection layer 708.

The operation of this embodiment will be described below with reference to FIGS. 14, 15A, and 15B under an assumption that a light signal 712 incident on the first waveguide layer 701 includes light components of a wavelength $\lambda_1$ selectively received by the diffraction grating 902, and light components of a wavelength $\lambda_2$ to be cut.

The light signal 712 incident on the first waveguide layer 701 is coupled to the $TE_0$ mode and guided in the light introduction region 711. In the wavelength selection region 710, light components of the wavelength $\lambda_1$ are selected by the diffraction grating 902, and are strongly coupled to the $TE_0$ mode having the central intensity in the second waveguide layer 702, while light components of the wavelength $\lambda_2$ are strongly coupled to the $TE_1$ mode having the central intensity in the first waveguide layer 701 and guided. In the light detection region 709, the light components of the wavelength $\lambda_1$ are strongly coupled to the $TE_0$ and $TE_1$ modes, and the light components of the wavelength $\lambda_2$ are strongly coupled to the $TE_2$ mode. In this case, the light detection layer 708 absorbs light to produce carriers. Most of the light components absorbed in this case are of the $TE_0$ and $TE_1$ modes each having the center of the photoelectric field intensity distribution in the light detection layer 708 and a high absorption coefficient, i.e., have the wavelength $\lambda_1$. As for the light components of the wavelength $\lambda_2$, the center of their photoelectric field intensity distribution is present in the first waveguide layer 701, and does not almost cover the light detection layer 708. Therefore, these light components are guided while being coupled to the $TE_2$ mode having a low absorption coefficient, and are not almost absorbed.

FIG. 15B shows a circuit for detecting an amount of light absorbed by the light detection layer 708.

A DC power source V1 is connected between the electrodes 904 and 905 through a resistor R1 and an ammeter 906, and a change in supplied current value is measured by the ammeter 906, thus detecting a change in resistance across the electrodes 904 and 905. As a result, an amount of light absorbed by the light detection layer 708 can be detected.

Figure 16:
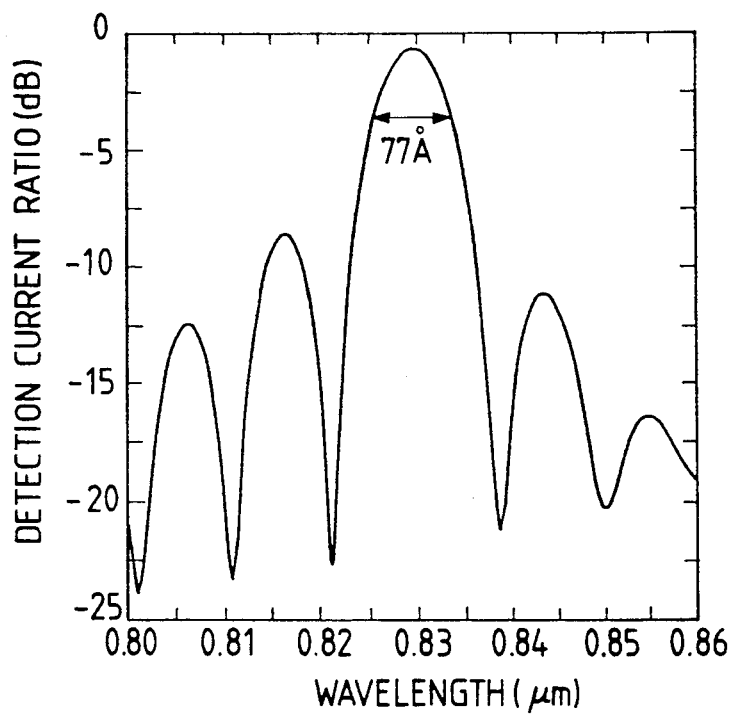
FIG. 16 is a graph showing the relationship between a wavelength of light detected by the photosensor of the fifth embodiment and a detected current ratio.

FIG. 16 shows a measurement result of a detected current ratio as a function of wavelengths by introducing light components ranging from wavelengths 0.80 µm to 0.86 µm as signal light 712 to the first waveguide layer 701. As shown in FIG. 16, the full width at half maximum at the central detection peak is 77 Å. Crosstalk between the wavelengths 0.83 µm and 0.85 µm is about 20 dB.

Figure 17:
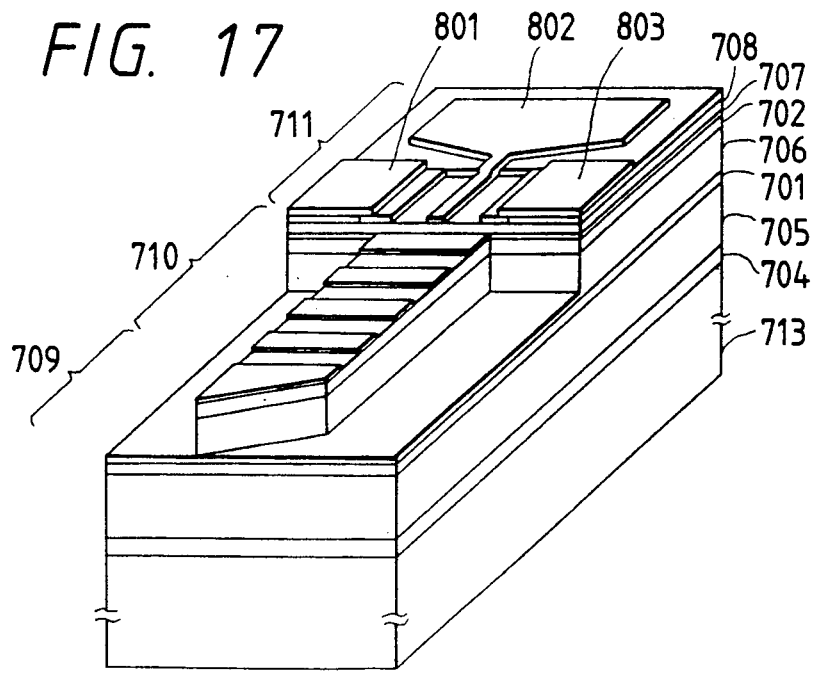
FIGS. 17 and 18 are respectively schematic views of the sixth and seventh embodiments in which the present invention is applied to photosensors.

FIG. 17 is a perspective view showing an outer appearance of the sixth embodiment of a photosensor according to the present invention.

In the fifth embodiment, light detection is performed by utilizing photoconductivity. However, in this embodiment, light detection is performed using electrodes having an FET structure. The manufacturing process and the structure are substantially the same as those in the fifth embodiment except for an electrode structure formed on the upper surface of the structure.

The same reference numerals in FIG. 17 denote the same parts as in FIG. 14, and a detailed description thereof will be omitted.

In the electrode structure of this embodiment, a third electrode is added between the two electrodes arranged in the fifth embodiment.

More specifically, a total of three electrodes are arranged, as shown in FIG. 17, and serve as a drain electrode 801, a gate electrode 802, and a source electrode 803. The drain and source electrodes 801 and 803 are formed of Au/Au-Ge films, and the gate electrode 802 arranged therebetween is formed of an Al film.

The gate electrode 802 is in Schottky contact with the light detection layer 708, and a light detection layer immediately under the gate electrode 802 serves as a depletion layer. When a negative voltage of $-2$ to $-5$ V is applied to the gate electrode 802 while a positive voltage is applied to the drain electrode 801 and a negative voltage is applied to the source electrode 803, the depletion layer is widened, and a current flowing in a source-drain path becomes 0 in a pinch-off state. In this state, when guided light propagating from the wavelength selection region 710 through the second waveguide layer 702 reaches the light detection region 9, the guided light is absorbed by the light detection layer 708, thus producing carriers. Holes of the produced carriers are absorbed by the gate electrode 802 to push up the depletion layer. Therefore, a channel current flows through the drain-source path. In this case, electrons of the above-mentioned carriers become a photocurrent flowing into the drain electrode 801.

More specifically, in a state wherein no guided light is incident on the light detection layer, the source-drain path is in a pinch-off state, and no drain current is generated. However, when guided light is incident, a channel current caused by a change in depletion layer and a photocurrent caused by production of carriers are generated. As a result, a drain current is generated, thus detecting light.

In this case, when a gate voltage is controlled to be an appropriate value, crosstalk among wavelengths can be improved, and a detected current can be amplified. Unlike in the fifth embodiment, since the detection operation is performed by using the FET structure, a photosensor which allows a high-speed response of GHz or more can be obtained.

Figure 18:
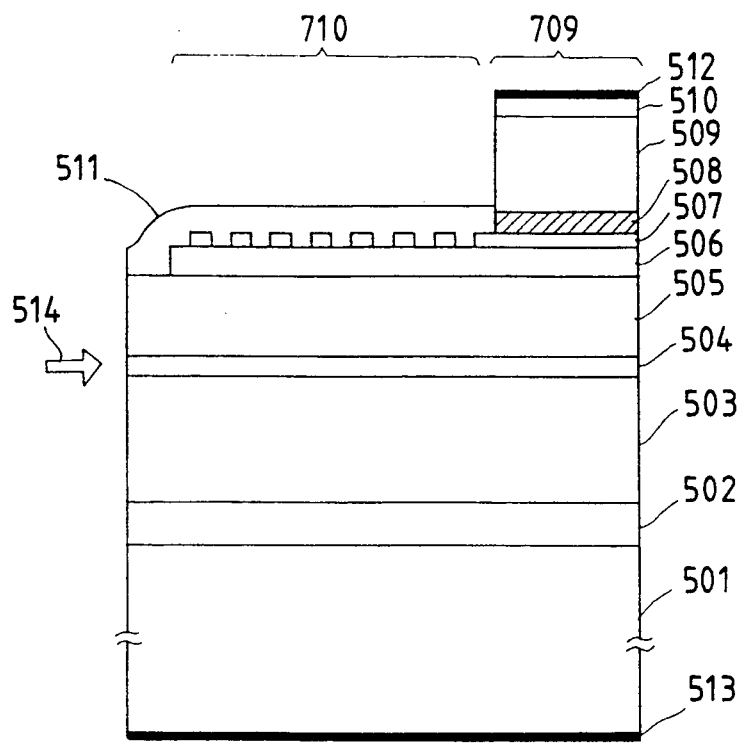

FIG. 18 shows the structure of the seventh embodiment of a photosensor according to the present invention.

In this embodiment, a PIN photodiode in which a light detection layer comprises an i-type layer as a light detection mechanism is formed.

The manufacturing process of this embodiment will be described below.

A 0.5-μm thick n-GaAs buffer layer 502, a 1.5-μm thick n-Al$_{0.5}$Ga$_{0.5}$As cladding layer 503, a 0.1-μm thick n-Al$_{0.3}$Ga$_{0.7}$As first waveguide layer 504, a 1.3-μm thick n-Al$_{0.5}$Ga$_{0.5}$As cladding layer 505, a 0.2-μm thick second waveguide layer 506 in which n-GaAs and n-Al$_{0.3}$Ga$_{0.7}$As layers were alternately stacked to constitute an MQW, a 0.15-μm thick n-Al$_{0.4}$Ga$_{0.6}$As diffraction grating layer 507, a 0.275-μm thick i-GaAs light detection layer 508, a 1.0-μm thick p-Al$_{0.5}$Ga$_{0.5}$As cladding layer 509, and a 0.5-μm thick p$^+$-GaAs capping layer 510 were sequentially grown on an n$^+$-GaAs substrate 501 by the MBE method. Thereafter, a resist mask for protecting a light detection region 709 was formed by the photolithographic method, and the p$^+$-GaAs capping layer 510 and the p-AlGaAs cladding layer 509 were etched by an etchant mixture of sulfuric acid, hydrogen peroxide solution, and water. The i-GaAs light detection layer 508 was selectively etched using an etchant mixture of ammonia and hydrogen peroxide solutions, instead. In this case, since the underlying layer of the i-GaAs light detection layer 508 is the n-Al$_{0.4}$Ga$_{0.6}$As diffraction grating layer 507 having an Al content of 40%, etching can be stopped at the i-GaAs layer.

Following the same procedures as in the fifth embodiment, a wavelength selection region 710 was formed. The pitch of the diffraction grating was 22 μm, its length was 690 μm, and its depth was 0.15 μm. An Si$_3$N$_4$ protective film 511 was formed on the entire structure except for the light detection layer 709.

Thereafter, an Au/Cr electrode 512 was formed on the capping layer 510, and an Au/Au-Ge electrode 513 was formed on the rear surface of the substrate 501.

In this embodiment, of signal light 514 input to the first waveguide layer 504, only light components having a wavelength to be selected are coupled the second waveguide layer 506 in the wavelength selection region 710. Thereafter, the light components are introduced into the light detection region 709, and are absorbed by the i-GaAs light detection layer 508 on the second waveguide layer. The light detection region 709 has a p-i-n structure, and a reverse bias voltage is applied across the electrodes 512 and 513. For this reason, carriers produced by absorption are detected as current signals.

Figure 19:
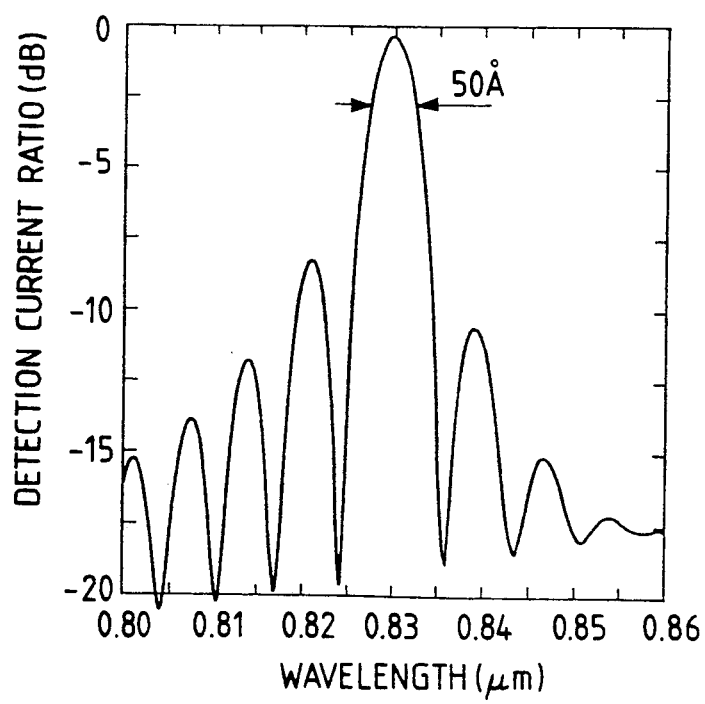
FIG. 19 is a graph showing the relationship between a wavelength of light detected by the photosensor of the seventh embodiment and a detected current ratio.

FIG. 19 shows the relationship between signals extracted by the photosensor of the seventh embodiment and light wavelengths.

In this embodiment, since the depth of each corrugation is smaller and a distance between the waveguide layers is larger than those of the fifth embodiment, the coupling length is increased. However, the full width at half maximum is as small as about 50 Å.

In the fifth to seventh embodiments, the light detection layer is formed and stacked on the second waveguide layer. Alternatively, the light detection layer may be formed beside the second waveguide layer, i.e., to be parallel thereto on a single plane, thus achieving the object of the present invention. More specifically, the positional relationship between the light detection layer and the waveguide layer is not particularly limited as long as signal light is coupled from the second waveguide layer to the light detection layer, and is not coupled from the first waveguide layer to the light detection layer.

Figure 20:
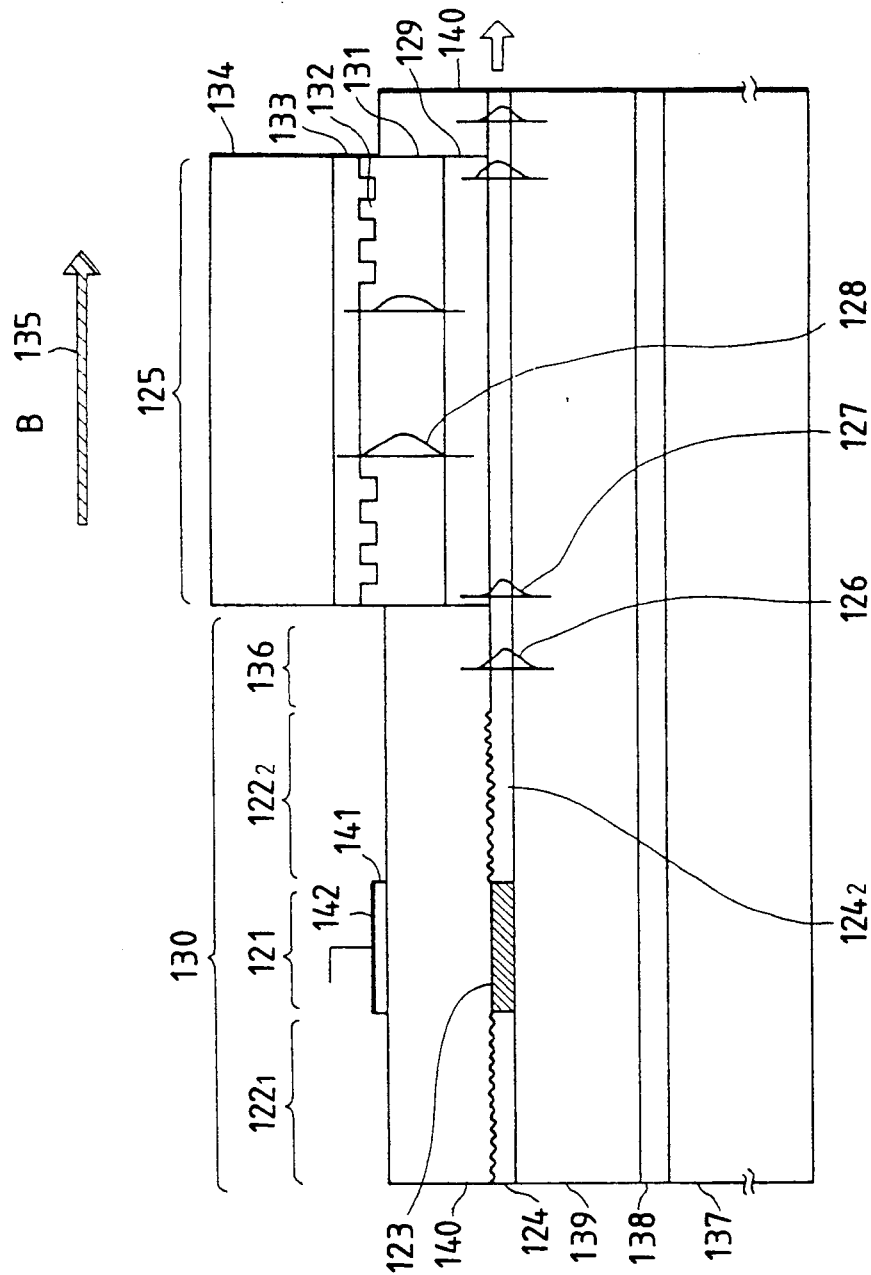
FIGS. 20 to 22 are schematic views of the first to third embodiments in which the present invention is applied to semiconductor lasers.

FIG. 20 is a schematic sectional view showing an embodiment in which the wavelength selective photocoupler described with reference to FIG. 2 is used in a semiconductor laser.

In this embodiment, a semiconductor laser unit 130 shown on the left-hand side in FIG. 20 and a light isolator unit 125 illustrated in an embedded form on the right-hand side of FIG. 20 are formed on a single semiconductor substrate 137. A laser beam emitted from the semiconductor laser unit 130 propagates to the right of FIG. 20, and emerges outwardly through the light isolator unit 125. The semiconductor laser unit is manufactured as follows. A GaAs buffer layer 138, an AlGaAs cladding layer 139, and a 0.3-μm thick first waveguide layer 124 in which GaAs and AlGaAs layers were alternately stacked to constitute an MQW were sequentially grown on a GaAs substrate 137. An AlGaAs cladding layer was grown on a portion, corresponding to the semiconductor layer unit 130, of the upper surface of the waveguide layer 124. The semiconductor laser unit 130 has its oscillation wavelength of 0.83 μm, and comprises a DBR (distributed feedback reflector) region 122$_1$, an active region 121, a DBR region 122$_2$, and a waveguide region 136. A diffraction grating for constituting a DBR was formed on a portion, corresponding to the DBR regions 122$_1$ and 122$_2$, of the upper surface of the waveguide layer 124. A portion, corresponding to the active region 121, of the waveguide layer 124 was formed as an active layer 123, and GaAs capping layer 141 and an electrode 142 for injecting a current into the active layer 123 were formed on the upper surface of the cladding layer 140.

The structure of the light isolator unit 125 will be described below.

A 0.5-μm thick CdTe buffer layer 129, and a 1.0-μm thick Cd$_{0.4}$Mn$_{0.6}$Te second waveguide layer 131 were sequentially epitaxially grown on the waveguide layer 124. A photoresist was applied on the upper surface of the waveguide layer 131, so that a photoresist mask having a pitch of 9.8 μm was formed by mask exposure. Thereafter, two diffraction gratings 132 each consisting of corrugations having a pitch of 9.8 μm were formed on two end portions of the upper surface of the waveguide layer 131 by RIBE. After the photoresist film was removed, a 0.3-μm thick CdTe first cladding layer 133 was grown by epitaxial growth, and a Cd$_{0.4}$Mn$_{0.6}$Te second cladding layer 134 was then grown thereon.

With the above-mentioned process, the light isolator unit 125 in which the CdMnTe second waveguide layer 131 and the GaAs/AlGaAs first waveguide layer 124 were stacked was formed in a region adjacent to the semiconductor laser.

In the two-layered waveguide, a guided mode established for a laser oscillation wavelength of 0.83 μm is a guided mode of a propagation constant $\beta_0 = 3.322$ having the central intensity in the waveguide layer 124. In addition, a leaky mode of a propagation constant $\beta_1$ (= 2.681) having a low refractive index and having the central intensity in the waveguide layer 131 is available as a mode of a small propagation loss. Light 126 emitted from the semiconductor laser unit 130 is incident on the light isolator unit 125 via the GaAs/AlGaAs waveguide layer 124, and is guided as guided light 127.

A propagation constant $\beta_{LD}$ of this guided light 127 is 3.343, which is very closer to the propagation constant $\beta_0 (= 3.322)$ of the guided mode of the GaAs/AlGaAs waveguide layer in the light isolator unit, and the light has a similar field distribution. Therefore, reflection and coupling losses upon incidence of the light are very small.

After the light 127 is incident on the light isolator unit 125, it is guided while maintaining its guided mode. However, in a region with the diffraction grating 132, the light is oscillated by the diffraction grating, and is coupled to other modes.

If a pitch Λ of each diffraction grating 132 is formed to compensate for a difference between the propagation constant $\beta_1$ of the leaky mode 128 having the central intensity in the waveguide layer 131 and the propagation constant $\beta_0$ of the guided mode having the central intensity in the waveguide layer 124 like in equation (1), these two modes are coupled, thus causing optical power shift.

The diffraction grating 132 of this embodiment is formed to satisfy equation (1).

Since the above-mentioned coupling has a nature of wavelength divergence, a wavelength region satisfying equation (1) is limited. However, the wavelength bandwidth is normally several tens of Å to several hundreds of Å, and is sufficiently wide with respect to a spectral width, a variation, and instability of a laser oscillation beam. Thus, no problem is posed.

When the semiconductor laser of this embodiment is used, an external magnetic field 135 having a predetermined magnitude and parallel to the propagation direction of the guided light 127 is applied to the light isolator unit 125. Thus, the external magnetic field 135 was applied to the light isolator manufactured as described above to be parallel to the propagation direction of light.

The operation of the light isolator formed as described above will be described below. Light 126 emitted from the semiconductor laser unit 130 propagates through the waveguide layer 124, and is incident on the light isolator unit 125. After incidence, guided light 127 is shifted to the waveguide layer 131 formed about the layer 124 in a region with the diffraction grating 132 to be converted to guided light 128 propagating through the waveguide layer 131. The guided light 128 is shifted again to the waveguide layer 124 in a region with another diffraction grating 132, and propagates therethrough.

The light 126 emitted from the semiconductor laser unit 130 is TE-polarized light. When the TE-polarized light propagates through the waveguide layer 131 applied with the external magnetic field 135, it causes a Faraday rotation of 45°. Therefore, the polarization direction of guided light emerging from the light isolator unit 125 is rotated through 45° from the direction of the TE-polarized light. When this light is reflected by various reflection surfaces of a coupling portion with a fiber, a fiber connector, and the like, and returned, it returns to the semiconductor laser unit 130 through the same optical path. However, since the light propagates the light isolator unit 125 in an opposite direction, it causes a Faraday rotation again, and its plane of polarization is further rotated through 45°. For this reason, the light returned to the semiconductor laser unit 130 is TM-polarized light. The semiconductor laser unit 130 which oscillates to emit TE-polarized light is not easily influenced by return TM-polarized light. Thus, the element of this embodiment can satisfactorily function as a light isolator.

In order to attain isolation having a large extinction ratio, a metal loading film may be added to the waveguide region 136 between the semiconductor laser unit 130 and the light isolator unit 125, or the waveguide region 136 may comprise a multilayered film of a metal and a dielectric to form a polarizer which allows forward TE-polarized light to pass therethrough but blocks backward TM-polarized light.

Figure 21:
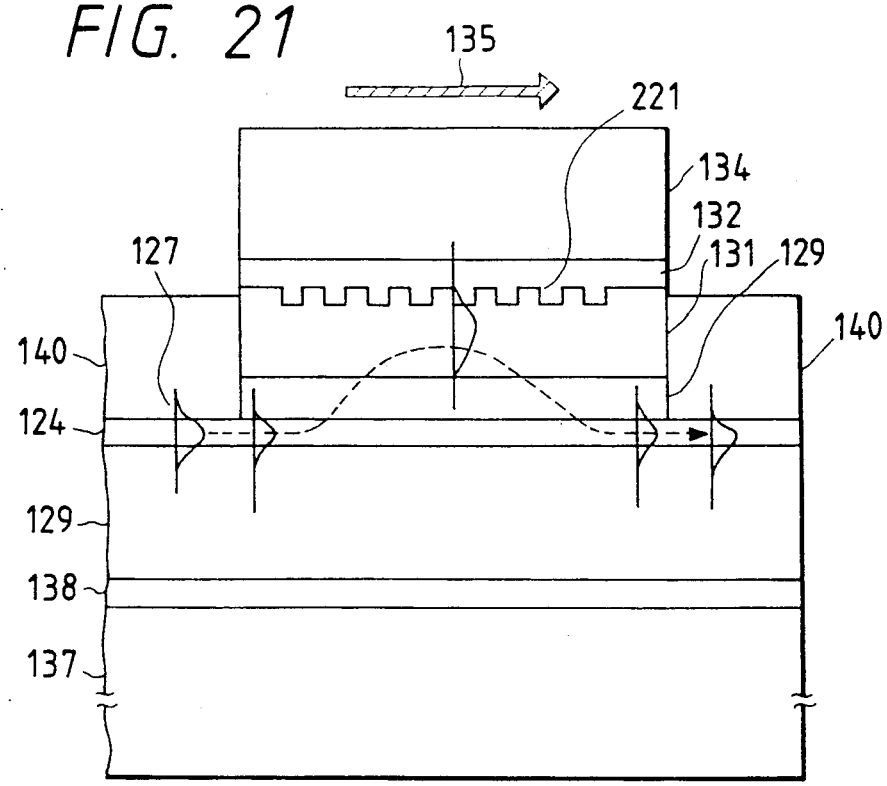

FIG. 21 shows the main part of the structure of the second embodiment of a semiconductor laser.

In this embodiment, a diffraction grating 221 having a length twice the perfect coupling length with respect to guided light 127 is formed near the central portion of the upper surface of the waveguide layer 131 in place of the diffraction grating 132 formed at two end portions of the upper surface of the waveguide layer 131 in the embodiment shown in FIG. 20. Other structures are the same as those in the embodiment shown in FIG. 20, and the same reference numerals in FIG. 21 denote the same parts as in FIG. 20.

In the structure shown in FIG. 20, after guided light 127 is coupled by one diffraction grating 132, it propagates through the waveguide layer 131 by a predetermined distance, and is then returned again to the waveguide layer 124 by the other diffraction grating 132. In the structure of this embodiment, the diffraction grating 221 having a length twice the perfect coupling length is formed to obtain the same effect as described above. The guided light 127 continuously undergoes power shift to the waveguide layer 124→the waveguide layer 131→the waveguide in the embodiment shown in FIG. 20.

Figure 22:
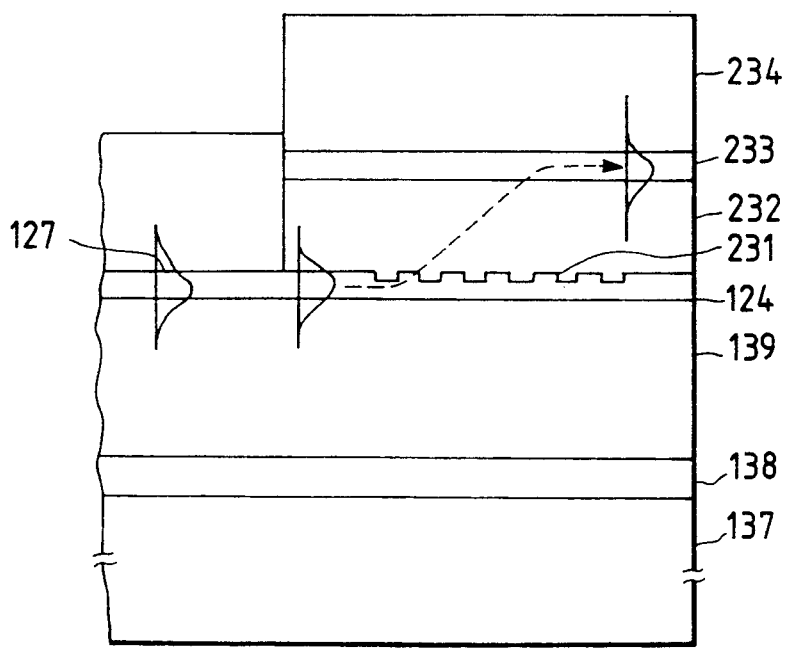

FIG. 22 shows the main part of the structure of the third embodiment of a semiconductor laser.

In this embodiment, the structure of a light isolator unit is different from that of the embodiment shown in FIG. 20, so that guided light emerges from a waveguide layer formed in the light isolator unit. The manufacturing process of this light isolator unit will be described below.

A diffraction grating 231 consisting of corrugations having a pitch of 16 μm was formed on the upper surface of the 0.3-μm thick waveguide layer 124 described above by the photolithographic method and RIBE. A 1-μm thick $Cd_{0.2}Mn_{0.8}Te$ cladding layer 232, a 0.3-μm thick $Cd_{0.9}Mn_{0.1}Te$ waveguide layer 233, and a 1.5-μm thick $Cd_{0.2}Mn_{0.8}Te$ cladding layer 234 were sequentially formed on the resultant structure by the epitaxial growth method.

The operation of this embodiment is the same as that in the embodiment shown in FIG. 20, and a difference between a propagation constant $\beta_0 = 3.320$ of a mode propagating through the waveguide layer 124 and a propagation constant $\beta_1 = 2.809$ of a mode propagating through the waveguide layer 233 is compensated for by the diffraction grating 231 having a pitch of 16 μm, thus causing optical power shift. As a result, guided light 127 emerges while its polarization direction is rotated through 45° through the waveguide layer 233. In this embodiment, guided light directly emerges from the waveguide layer 233 without returning t the waveguide layer 124. In this embodiment, the waveguide layer 233 has a propagation mode surrounded by the cladding layers 232 and 234 having a low refractive index, and a propagation loss is very small unlike in the embodiment shown in FIG. 20.

Figure 23A:
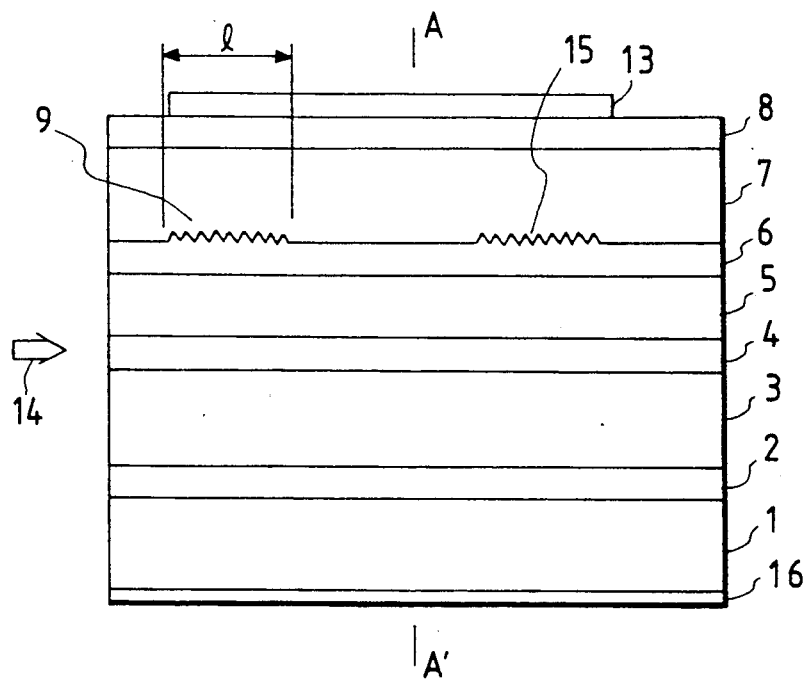
FIGS. 23A and 23B are respectively a side view and a front sectional view showing the first embodiment in which the present invention is applied to an optical amplifier.
Figure 23B:
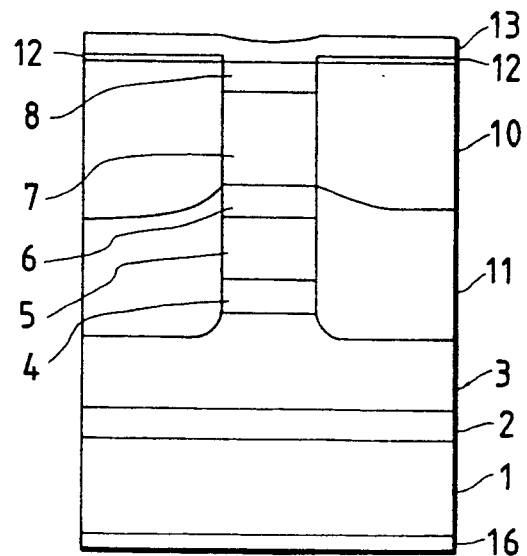

FIG. 23A is a side sectional view showing an embodiment in which the wavelength selective photocoupler described with reference to FIG. 2 is used in an optical amplifier. FIG. 23B is a sectional view taken along a line A—A' of this optical amplifier. This embodiment is manufactured as follows.

An n-GaAs buffer layer 2, a 1.5-μm thick n-Al$_{0.5}$Ga$_{0.5}$As first cladding layer 3, a 0.2-μm thick waveguide layer 4 in which non-doped GaAs and Al$_{0.5}$Ga$_{0.5}$As layers were alternately stacked to constitute an MWQ, an n-Al$_{0.5}$Ga$_{0.5}$As second cladding layer 5, and a 0.45-μm thick active layer 6 in which non-doped GaAs and Al$_{0.4}$Ga$_{0.6}$As layers were alternately stacked to constitute an MQW were sequentially grown on an n-GaAs substrate 1. As the crystal growth method so far, a metal organic chemical vapor deposition (MO-CVD) method is used. However, the MBE method may be used. After the active layer 6 was formed, two diffraction gratings 9 and 15 suitable for wavelengths of signal light to be optically amplified were formed on the upper surface of the active layer 6 by photolithography to be separated at a predetermined distance. A 1.5-μm thick p-Al$_{0.5}$Ga$_{0.5}$As third cladding layer 7, a 0.2-μm thick p$^+$-GaAs capping layer 8, and an insulating layer 12 were sequentially formed on the upper portion of the resultant structure. A p-type electrode 13 was formed on a portion, corresponding to a portion between the diffraction gratings 9 and 15, of the upper surface of the capping layer 8, and an n-type electrode 16 was formed on the rear surface of the substrate 1. The third cladding layer 7 and the capping layer 8 were formed by the LPE method but may be formed by the MO-CVD method.

In order to form a three-dimensional structure of the waveguide layer 4, the two end portions of the waveguide layer 4 were removed by wet etching to expose the first cladding layer 3, as shown in FIG. 23B. A p-Al$_{0.5}$Ga$_{0.5}$As buried layer 11, and an n-Al$_{0.5}$Ga$_{0.5}$As buried layer 10 were grown on these removed portions to form a buried structure.

In this embodiment having the two-layered waveguide (the waveguide layer 4 and the active layer 6), input light 14 on which a plurality of laser beams of wavelengths 0.8 μm to 0.86 μm in units of 0.01 μm is input and coupled to the waveguide layer 4. Modes established in the two-layered waveguide are the same as those described with reference to FIG. 3. The waveguide layer 4 of this embodiment corresponds to the first waveguide layer 101 described above, and the active layer 6 corresponds to the second waveguide layer 102 described above.

The input light 14 is coupled to an odd mode 32 having a power peak in the waveguide layer 4, and propagates through the waveguide layer 4. In a region without the diffraction grating 9, since the odd mode 32 has a different propagation constant from that of an even mode 31, these modes are not almost coupled to each other (a maximum of about 1%), and almost independently propagate through the corresponding layers. However, in a region with the diffraction grating 9, if the relationship given by equation (1) is established between a propagation constant $\beta_0$ of the odd mode 32 and a propagation constant $\beta_1$ of the even mode 31, optical power shift occurs.

When the above-mentioned optical power shift occurs, signal light included in guided light of the odd mode 32 coupled to the input light 14 is converted to guided light of the even mode 31. Therefore, the signal line propagates through the active layer 6. Light components of other wavelengths in the signal light do not shift to the active layer 6, and propagate through the waveguide layer 4.

A region length ( for causing perfect coupling of each of the diffraction gratings 9 and 15 can be obtained by equation (2).

In order to perform wavelength filtering to have light of a wavelength of 0.83 μm as a central wavelength, $\Lambda = 9$ μm from equation (1), and the perfect coupling length $l = 250$ μm from equation (2). The signal line shifted to the active layer by the diffraction grating 9 is amplified during propagation since the active layer 6 under the electrode 13 serves as a laser amplifier unit having a gain. The amplified signal light propagating through the active layer 6 is coupled to the waveguide layer 4 by the diffraction grating 15, as described above, and emerges from the end face of the layer 4.

In this manner, when current injection is performed only between the diffraction grating 9 and 15, a region of the active layer 6 excluding this section serves as an absorption waveguide. Therefore, the amplified signal light is never influenced by an unnecessary signal input, and naturally emerging light having wavelengths other than a signal wavelength from the amplifier can be eliminated. The active layer 6 may be removed by etching to leave a portion between the two diffraction gratings, thus obtaining the same effect as described above.

Figure 24A:
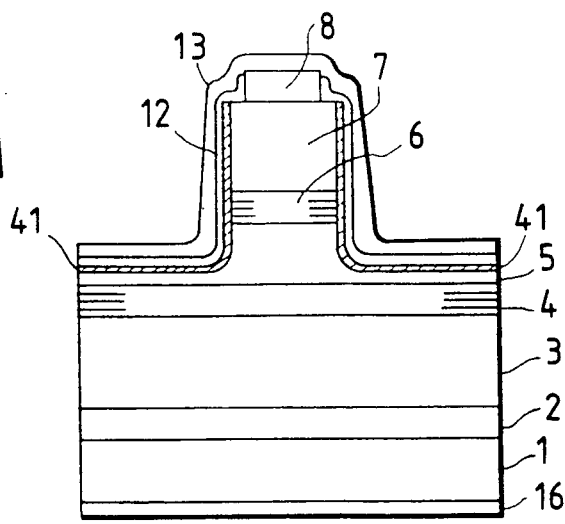
FIGS. 24A and 24B are respectively a side view and a front sectional view showing the second embodiment in which the present invention is applied to an optical amplifier.
Figure 24B:
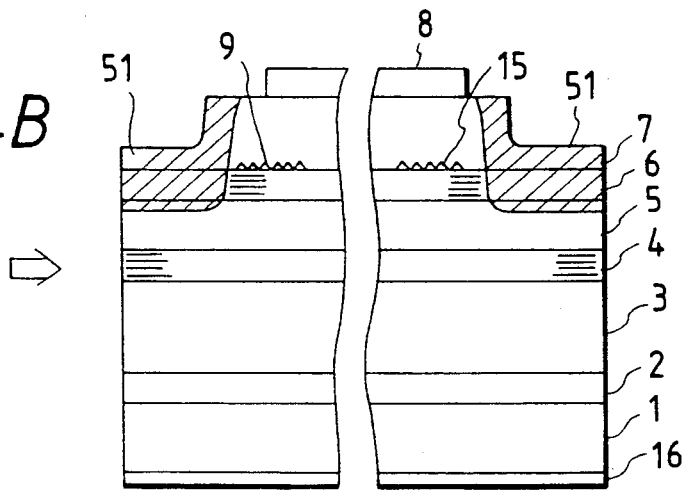

FIGS. 24A and 24B are views showing the structure of the second embodiment of an optical amplifier.

In this embodiment, lateral optical confinement realized by the buried layers 10 and 11 in the embodiment shown in FIGS. 23A and 23B is achieved by removing two end portions of the structure by etching. The structure of this embodiment is substantially the same as that of the embodiment shown in FIGS. 23A and 23B, and the same reference numerals in FIGS. 24A and 24B denote the same parts as in FIGS. 23A and 23B.

In the structure of this embodiment, after the third cladding layer 7 was formed, its two end portions are etched to expose the second cladding layer 5 (or the first cladding layer 3) by the reactive ion etching method (the RIBE or RIE method) using photolithography, thus forming a three-dimensional waveguide, as shown in FIGS. 24A and 24B. A p-type impurity having a conductivity type opposite to the conductivity type of the third cladding layer 7 was thermally diffused in the etched end face to form an impurity diffusion layer 41. The same thermal diffusion was performed in the input/output end faces of the active layer 6, as shown in FIG. 24B, thus forming an impurity diffusion layer 51.

The impurity diffusion layers 41 and 51 are formed to disorder the two end portions of the active layer 6 and the waveguide layer 4. The reason for this will be described below. When the three-dimensional waveguide like in this embodiment is formed, since a large number of interface levels are present in the two end portions of the active layer 6, injected carriers are recoupled through the interface levels, so that the number of insignificant injected carriers is increased, and signal light shifted from the waveguide layer 4 is undesirably absorbed.

In the structure of this embodiment, the impurity diffusion layer 41 disorders a superlattice structure in a direction perpendicular to guided light in the active layer 6 and the waveguide layer 4, and the impurity diffusion layer 51 disorders a superlattice structure in a direction parallel to guided light in the active layer 6. Therefore, the active layer 6 can be prevented from receiving unnecessary light, and naturally emerging light other than a signal wavelength produced in an amplifier region can be scattered. It can also be prevented that the scattered light emerges together with the amplified signal light.

In the structure of this embodiment, the number of crystal growth steps can be decreased as compared to the embodiment shown in FIGS. 23A and 23B, and a waveguide width can be controlled by a thermal diffusion time. Therefore, fine control can be realized.

Figure 25:
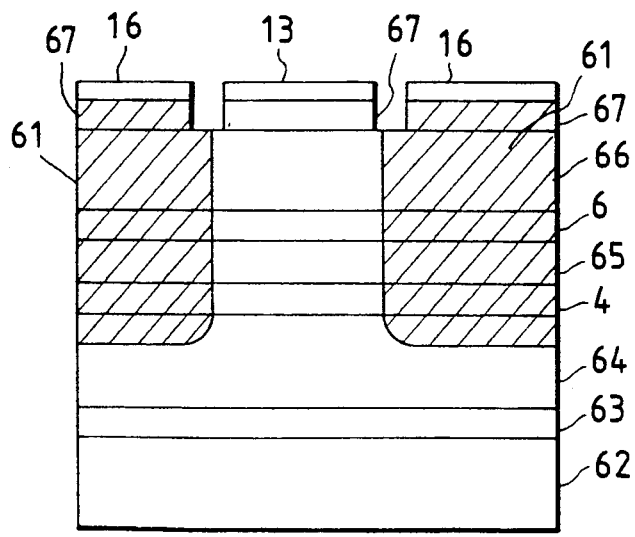
FIG. 25 is a schematic sectional view showing the third embodiment in which the present invention is applied to an optical amplifier.

FIG. 25 shows the structure of the third embodiment of an optical amplifier.

In this embodiment, unlike in the first and second embodiments of the optical amplifiers, a substrate 62, a buffer layer 63, a first cladding layer 64, a waveguide layer 4, a second cladding layer 65, and an active layer 6 were formed using non-impurity-doped GaAs and AlGaAs. After these films were formed, a diffraction grating (not shown) was formed on the active layer 6, and an n-type third cladding layer 66 and an n-type capping layer 67 are regrown thereon. Thereafter, an $Si_3N_4$ film was formed as a diffusion mask, and 6-$\mu$m wide stripes were formed in the mask by photolithography. Thus, the n-GaAs capping layer 67 was selectively etched using the above mask and an etchant containing ammonia and hydrogen peroxide solutions. ZnAs and a sample were vacuum-sealed on the capping layers 67 on the two ends of the structure, and were thermally diffused at 650° C. for 2.5 hours, thus forming an impurity diffusion layer. In this case, a diffusion front reached the first cladding layer 64, and both the waveguide and the active layer 6 were disordered by Zn, thus forming a three-dimensional waveguide. Thereafter, the diffusion mask was removed, and the p-type layers diffused in the capping layers 67 were removed by etching. After a p-type electrode 13 was formed, an insulating film ($SiO_3$) was formed. Through holes were formed in the insulating film by photolithography, and an n-type electrode 16 was formed through each through hole.

The element performance of this embodiment is not so different from those of the first and second embodiments of the optical amplifiers. However, in this embodiment, since layers up to the active layers 6 comprise non-doped layers, the degree of freedom in element design can be improved in the manufacture of an optical integrated circuit, and the like.

In this manner, in the optical amplifiers of the first to third embodiments, since the two waveguides (the active layer and the waveguide layer) are formed in a direction of thickness during crystal growth, an interval between the waveguides can be precisely determined. In addition, since the diffraction grating is commonly used, crosstalk between the waveguide layer receiving incident light and the active layer can be reduced, and designs of crystal growth and the diffraction grating are facilitated. As a result, a device can be easily optimized.

In the above embodiments, the input/output waveguide layer and the active layer comprise the MQWs as the superlattice structure, but may comprise conventional thin-film waveguides. The input/output waveguide layer may be formed on the upper portion of the active layer. The position of the diffraction grating can be arbitrarily determined as long as it falls within an overlapping region of the even and odd modes 31 and 32 shown in FIG. 3. A large number of pairs of diffraction gratings having a plurality of different cycles may be arranged to perform light amplification for a plurality of wavelengths.

The present invention may be used in various applications in addition to the above-mentioned embodiments.

For example, each of the above embodiments comprises GaAs-based materials but may comprise III-V group compound semiconductors such as InGaAs, semiconductors such as Si, Ge, and the like, II-VI group compound semiconductors such as CdTe, and the like in accordance with wavelengths to be detected.

The present invention incorporates all these applications within the spirit and scope of the appended claims.

What is claimed is:

1. A photosensor comprising:
   a substrate;
   a first waveguide layer formed on said substrate;
   a second waveguide layer formed on said first waveguide layer to be stacked in a direction of thickness, said second waveguide layer having a guided mode different from that of said first waveguide layer;
   a diffraction grating formed on an overlapping region of the guided modes of said first and second waveguide layers, said diffraction grating diffracting a light component having a specific wavelength range of light propagating through said first waveguide layer and converting the guided mode thereof to be coupled to said second waveguide layer;
   a light absorption layer for absorbing at least some light components of the light components coupled to said second waveguide layer; and
   an electrode for converting the light components absorbed by said light absorption layer into an electrical signal and outputting the electrical signal.

2. A photosensor according to claim 1, wherein said light absorption layer is formed in series with said second waveguide layer in a propagation direction of light.

3. A photosensor according to claim 1, wherein said light absorption layer comprises an i-type semiconductor, and p- and n-type semiconductor layers are formed on two sides of said light absorption layer, so that said photosensor constitutes a PIN photodiode.

4. A photosensor according to claim 1, wherein said diffraction grating comprises corrugations formed on said second waveguide layer.

5. A photosensor according to claim 1, wherein said photosensor satisfies the following equation:

$$\beta_1(\lambda) - \beta_0(\lambda) = 2\pi/\Lambda$$

where $\lambda$ is a wavelength of guided light $\beta_0(\lambda)$ is a propagation constant of the guided mode of said first waveguide layer, $\beta_1(\lambda)$ is a propagation constant of the guided mode of said second waveguide layer, and $\Lambda$ is a pitch of said diffraction grating.

6. A photosensor according to claim 5, wherein said photosensor satisfies the following equation:

$$l = \pi/2g$$

$$g = \int \epsilon_1 A_1(x) \epsilon_0 dx$$

where l is a region length of said diffraction grating, $\epsilon_0$ is an electric field intensity distribution of the guided mode of said first waveguide layer, and $\epsilon_1$ is an electric field intensity distribution of the guided mode of said second waveguide layer, and $A_1(x)$ is a component corresponding to 1st-order diffracted light of the Fourier expansion of said diffraction grating.

7. A photosensor according to claim 1, further comprising first, second, and third cladding layers, said first cladding layer, said first waveguide layer, said second cladding layer, and said second waveguide layer being sequentially stacked in an order named on said substrate.

8. A photosensor according to claim 7, wherein said substrate and said layers comprise a compound selected from the group consisting of GaAs and AlGaAs.

9. A photosensor according to claim 8, wherein each of said first and second waveguide layers comprises a multi-quantum well structure.

10. A photosensor comprising:
a substrate;
a first waveguide layer formed on said substrate;
a second waveguide layer formed on said first waveguide layer to be stacked in a direction of thickness, said second waveguide layer having a guided mode different from that of said first waveguide layer, and absorbing light propagating therethrough;
a diffraction grating formed on an overlapping region of the guided modes of said first and second waveguide layers, said diffraction grating diffracting a light component having a specific wavelength range of light propagating through said first waveguide layer and converting the guided mode thereof to be coupled to said second waveguide layer; and
an electrode for converting the light components absorbed by said second waveguide layer into an electrical signal and outputting the electrical signal.

11. A photosensor according to claim 10, further comprising first, second, and third cladding layers, said first cladding layer, said first waveguide layer, said second cladding layer, and said second waveguide layer being sequentially stacked in an order named on said substrate.

12. A photosensor according to claim 11, wherein said substrate and said layers comprise a compound selected from the group consisting of GaAs and AlGaAs.

13. A photosensor according to claim 12, wherein each of said first and second waveguide layers comprises a multi-quantum well structure.

14. A photosensor according to claim 11, wherein said first waveguide layer and said first and second cladding layers comprise a semiconductor of a first conductivity type, said third cladding layer comprises a semiconductor of a second conductivity type, and said second waveguide layer comprises an i-type semiconductor, so that said photosensor constitutes a PIN photodiode.

15. A photosensor according to claim 14, wherein the first conductivity type is an n type, and the second conductivity type is a p type.

16. A photosensor according to claim 11, wherein said substrate comprises a semi-insulating semiconductor, said first and second waveguide layers and said first, second, and third cladding layers comprise an i-type semiconductor, and a stripe-like region extending in a propagation direction of light is formed in a portion of a multilayered structure consisting of said substrate, said first and second waveguide layers, and said first, second, and third cladding layers, p- and n-type regions being formed on two sides of said stripe-like region, so that said photosensor constitutes a PIN photodiode.

17. A photosensor according to claim 11, wherein said substrate comprises a semi-insulating semiconductor, said first waveguide layer and said first, second, and third cladding layers comprise an i-type semiconductor, said second waveguide layer comprises an n-type semiconductor, and a stripe-like region extending in a propagation direction of light is formed in a portion of a multilayered structure consisting of said substrate, said first and second waveguide layers, and said first, second, and third cladding layers, p- and n-type regions being formed on two sides of said stripe-like region, source and drain electrodes being in contact with said p- and n-type regions, an insulating layer being formed on a portion said third cladding layer on said stripe-like region, and a gate electrode being formed on said insulating layer.

18. A photosensor according to claim 17, wherein said diffraction grating comprises corrugations formed on said second cladding layer.

19. A photosensor according to claim 10, wherein said diffraction grating comprises corrugations formed on said second waveguide layer.

20. A photosensor according to claim 10, wherein said photosensor satisfies the following equation:

$$\beta_1(\lambda) - \beta_0(\lambda) = 2\pi/\Lambda$$

where $\lambda$ is a wavelength of guided light, $\beta_0(\lambda)$ is a propagation constant of the guided mode of said first waveguide layer, $\beta_1(\lambda)$ is a propagation constant of the guided mode of said second waveguide layer, and $\Lambda$ is a pitch of said diffraction grating.

21. A photosensor according to claim 20, wherein said photosensor satisfies the following equation:

$$l = \pi/2g$$

$$g = \int \epsilon_1 A_1(x) \epsilon_0 dx$$

where l is a region length of said diffraction grating, $\epsilon_0$ is an electric field intensity distribution of the guided mode of said first waveguide layer, and $\epsilon_1$ is an electric field intensity distribution of the guided mode of said second waveguide layer, and $A_1(x)$ is a component corresponding to 1st-order diffracted light of the Fourier expansion of said diffraction grating.

22. A photosensor comprising:
a substrate;
a first waveguide layer formed on said substrate;
a second waveguide layer formed on said first waveguide layer to be stacked in a direction of thickness, said second waveguide layer having guided modes different from those of said first waveguide layer;
a diffraction grating formed on an overlapping region on the guided modes of said first and second waveguide layers, said diffraction grating diffracting a light component having a specific wavelength range of light propagating through said first waveguide layer and converting the guided mode thereof to be coupled to said second waveguide layer;
a light absorption layer formed on said second waveguide layer to be stacked in a direction of thickness, guided modes of said light absorption layer less overlapping those of said first waveguide layer, and much overlapping those of said second waveguide layer; and
an electrode for converting the light components absorbed by said light absorption layer into an electrical signal and outputting the electrical signal.

23. A photosensor according to claim 22, wherein said photosensor is divided into a waveguide region, a wavelength section region, and a light detection region in a propagation direction of light, and said light absorption layer is formed in only said light detection region.

24. A photosensor according to claim 23, wherein said diffraction grating is formed in only the wavelength selection region.

25. A photosensor according to claim 22, further comprising first, second, and third cladding layers, said first cladding layer, said first waveguide layer, said second cladding layer, and said second waveguide layer being sequentially stacked in an order named on said substrate.

26. A photosensor according to claim 25, wherein said second cladding layer and said second waveguide layer constitute stripe-like ridges extending in the propagation direction of light.

27. A photosensor according to claim 25, further comprising a fourth cladding layer formed on said light absorption layer, and wherein said first waveguide layer and said first, second and third cladding layers comprise a semiconductor of a first conductivity type, and said fourth cladding layer comprises a semiconductor of a second conductivity type, so that said photosensor constitutes a PIN photodiode.

28. A photosensor according to claim 27, wherein the first conductivity type is an n type, and the second conductivity type is a p type.

29. A photosensor according to claim 25, wherein said substrate and said layers comprise a compound selected from the group consisting of GaAs and AlGaAs.

30. A photosensor according to claim 26, wherein each of said first and second waveguide layers comprises a multi-quantum well structure.

31. A photosensor according to claim 22, wherein said electrode comprises source, drain, and gate electrodes which constitute a field effect transistor together with said light absorption layer.

32. A photosensor according to claim 22, wherein said diffraction grating comprises diffraction grating formation layers cyclically formed on said second waveguide layer.

33. A photosensor according to claim 22, wherein said photosensor satisfies the following equation:

$$\beta_1(\lambda) - \beta_0(\lambda) = 2\pi/\Lambda$$

where $\lambda$ is a wavelength of guided light, $\beta_0(\Lambda)$ is a propagation constant of the guided mode of said first waveguide layer, $\beta_1(\lambda)$ is a propagation constant of the guided mode of said second waveguide layer, and $\Lambda$ is a pitch of said diffraction grating.

34. A photosensor according to claim 33, wherein said photosensor satisfies the following equation:

$$l = \pi/2g$$

$$g = \int \epsilon_1 A_1(x)\epsilon_0 dx$$

where l is a region length of said diffraction grating, $\epsilon_0$ is an electric field intensity distribution of the guided mode of said first waveguide layer, and $\epsilon_1$ is an electric field intensity distribution of the guided mode of said second waveguide layer, and $A_1(x)$ is a component corresponding to 1st-order diffracted light of the Fourier expansion of said diffraction grating.

35. A photosensor comprising:
a substrate;
a first waveguide layer formed on said substrate, said first waveguide layer having an end face where light is inputted;
a second waveguide layer formed on said substrate to be stacked to said first waveguide layer in a direction of thickness, said second waveguide layer having a guided mode different from that of said first waveguide layer, a part of said second waveguide layer at the light input side being removed by the etching so that the light is inputted only to said first waveguide layer;
a diffraction grating formed on an overlapping region of the guided modes of said first and second waveguide layers, said diffraction grating diffracting a light component having a specific waveguide range of the light propagating through said first waveguide layer and converting the guided mode thereof so as to be coupled to said second waveguide layer; and
means for detecting the light coupled to said second waveguide layer.

36. A photosensor according to claim 35, wherein the end face of said second waveguide layer at the light input side is being obliquely etched with respect to the longitudinal direction of said second waveguide layer.

37. A photosensor according to claim 35, wherein said detection means comprises a light absorption layer formed on said substrate to be stacked to said second waveguide layer in the direction of the thickness and an electrode for converting the light absorbed in said light absorption layer into an electric signal to be outputted.

38. A photosensor according to claim 37, wherein said photosensor is divided into a waveguide region, a wavelength selection region and a light detection region, in a light propagating direction, and said light absorption layer is formed in only said light detection region.

39. A photosensor according to claim 38, wherein said diffraction grating is formed in only said wavelength selection region.

40. A photosensor according to claim 37, further comprising first, second and third cladding layer, wherein the lamination is made in success of the first cladding layer, the first waveguide layer, the second cladding layer, the second waveguide layer, the third cladding layer and the light absorption layer on the substrate.

41. A photosensor according to claim 40, wherein said second cladding layer and said second waveguide layer constitute stripe-like ridges extending in the light propagating direction.

42. A photosensor according to claim 40, further comprising a fourth cladding layer formed on said light absorption layer, and said first and second waveguide layers, said first, second and third cladding layers comprise a semiconductor having a first conductivity type, and said fourth cladding layer comprises a semiconductor having a second conductivity type, and said light absorption layer comprises a semiconductor of i-type, so that said photosensor constitutes a PIN photodiode.

43. A photosensor according to claim 42, wherein said first conductivity type is an n-type and said second conductivity type is a p-type.

44. A photosensor according to claim 40, wherein said substrate and each layer comprises GaAs or AlGaAs.

45. A photosensor according to claim 37, wherein said electrode comprises a source electrode, a drain electrode and a gate electrode to constitute a field-effect transistor together with said light absorption layer.

46. A photosensor according to claim 35, wherein said first and second waveguide layers have a multi-quantum well structure.

47. A photosensor according to claim 35, wherein said diffraction grating comprises diffraction grating formation layers cyclically formed on said second waveguide layer.

48. A photosensor according to claim 35, wherein said photosensor satisfies the following equation:

$$\beta_1(\lambda) - \beta_0(\lambda) = 2\pi/\Lambda$$

where $\lambda$ is a waveguide of the guided light, $\beta_0(\lambda)$ is a propagation constant of the guided mode of said first waveguide layer, $\beta_1(\lambda)$ is a propagation constant of the guided mode of said second wavelength layer, and $\Lambda$ is a pitch of said diffraction grating.

49. A photosensor according to claim 48, wherein said photosensor satisfies the following equations:

$$l = \pi/2g$$

$$g = \int \epsilon_1 A_1(x) \epsilon_0 dx$$

where $l$ is a region length of said diffraction grating, $\epsilon_0$ is an electric field intensity distribution of the guided mode of said first waveguide layer, and $\epsilon_1$ is an electric field intensity distribution of the guided mode of said second waveguide layer, and $A_1(x)$ is a component corresponding to 1st-order diffracted light of the Fourier expansion of said diffraction grating.

50. An optical device comprising:
   a substrate;
   a first waveguide layer formed on said substrate having at least one end face, said first waveguide layer propagating a light introduced from said end face;
   a second waveguide layer formed on said first waveguide layer to be stacked in a direction of thickness, said second waveguide layer having at least one end face at the same side of said end face of said first waveguide layer, said second waveguide layer having a guided mode different from that of said first waveguide layer;
   a diffraction grating formed on an overlapping region of the guided modes of said first and second waveguide layers, said diffraction grating diffracting a light component having a specific wavelength of light propagating through said first waveguide layer and converting the guided mode thereof to be coupled to said second waveguide layer; and
   means provided on an end face of said second waveguide layer for preventing a light from being incident on said second waveguide layer.

51. A device according to claim 50, wherein said means for preventing a light from being incident on said second waveguide layer is formed such that the end face of said second waveguide layer is obliquely etched with respect to the longitudinal direction of the second waveguide layer.

52. A device according to claim 50, wherein said means for preventing a light from being incident on said second waveguide layer comprises an impurity diffusion layer provided on the end face of said second waveguide layer.

53. A device according to claim 52, wherein said second waveguide layer has a super lattice structure, and said impurity diffusion layer is formed such that impurity is caused to be diffused in said second waveguide layer to make disorder of said super lattice structure.

54. A device according to claim 50, wherein said diffraction grating comprises a corrugation formed on said second waveguide layer.

55. A device according to claim 50, wherein the following equation is satisfied:

$$\beta_1(\lambda) - \beta_0(\lambda) = 2\pi/\Lambda$$

where $\lambda$ is a wavelength of the guided light, $\beta_0(\lambda)$ is a propagation constant of the guided mode of said first waveguide layer, $\beta_1(\lambda)$ is a propagation constant of the guided mode of said second waveguide layer and $\Lambda$ is a pitch of said diffraction grating.

56. A device according to claim 55, wherein the following equations are satisfied:

$$l = \pi/2g; \text{ and}$$

$$g = \int \epsilon_1 A_1(X) \epsilon_0 dX$$

where $l$ is a region length of said diffraction grating, $\epsilon_0$ is an electric field intensity distribution of the guided mode of said first waveguide layer, $\epsilon_1$ is an electric field intensity distribution of the guided mode of said second waveguide layer and $A_1(X)$ is a component corresponding to 1st-order diffracted light of the Fourier expansion of said diffraction grating.

57. A device according to claim 50 further comprising a first, a second and a third cladding layers, wherein lamination is made in success of said first cladding layer, said first waveguide layer, said second cladding layer, said second waveguide layer, said third cladding layer and a light absorption layer on the substrate.

58. A device according to claim 57, wherein said substrate and all of each layer comprise GaAs or AlGaAs.

59. A device according to claim 58, wherein said first and second waveguide layers have multi-quantum well structures.

* * * * *

UNITED STATES PATENT AND TRADEMARK OFFICE
CERTIFICATE OF CORRECTION

PATENT NO. : 5,140,149

DATED : August 18, 1992

INVENTOR(S) : HAJIME SAKATA, ET AL.

It is certified that error appears in the above-identified patent and that said Letters Patent is hereby corrected as shown below:

COVER PAGE
   item [56] References Cited
        "0187979 12/1985 Fed. Rep. of Germany" should read
--0187979 12/1985 Dem. Rep. of Germany--.

COLUMN 4
    Line 15, "expitaxial" should read --epitaxial--.
    Line 16, "method" should read --method.--.

COLUMN 7
    Line 32, "layer 30" should read --layer 301--.

COLUMN 8
    Line 7, "performed. In" should read --performed. ¶ In--.

COLUMN 12
    Line 36, "state. In" should read --state. ¶ In--.
    Line 39, "region 9," should read --region 709,--.

COLUMN 16
    Line 27, "layer 124→the" should read --layer 124 → the--.
    Line 28, "131→the waveguide" should read --131 → the waveguide layer 124, thus obtaining the same Faraday rotation as--.
    Line 59, "returning t" should read --returning to--.

COLUMN 17
    Line 6, "MWQ," should read --MQW,--.

COLUMN 20
    Line 48, "light" should read --light,--.

UNITED STATES PATENT AND TRADEMARK OFFICE
CERTIFICATE OF CORRECTION

PATENT NO. : 5,140,149
DATED : August 18, 1992
INVENTOR(S) : HAJIME SAKATA, ET AL.

It is certified that error appears in the above-identified patent and that said Letters Patent is hereby corrected as shown below:

COLUMN 21
  Line 53, "n type," should read --n-type,--.
  Line 54, "p type." should read --p-type.--.

COLUMN 22
  Line 11, "portion" should read --portion of--.

COLUMN 23
  Line 28, "n type," should read --n-type--.
  Line 29, "p type." should read --p-type.--.

COLUMN 25
  Line 37, "substrate" should read --substrate and--.

COLUMN 26
  Line 44, "claim 50" should read --claim 50,--.

Signed and Sealed this

Thirtieth Day of November, 1993

Attest:

BRUCE LEHMAN

Attesting Officer

Commissioner of Patents and Trademarks